(12) United States Patent
Chung

(10) Patent No.: US 6,847,242 B2
(45) Date of Patent: Jan. 25, 2005

(54) ESCALATOR CODE-BASED DELAY-LOCKED LOOP APPARATUS AND CORRESPONDING METHODS

(75) Inventor: In-Young Chung, Suwon (KR)

(73) Assignee: Samsung Electronics, Kyunggi-Do (KR)

(*) Notice: Subject to any disclaimer, the term of this patent is extended or adjusted under 35 U.S.C. 154(b) by 0 days.

(21) Appl. No.: 10/825,204

(22) Filed: Apr. 16, 2004

(65) Prior Publication Data

US 2004/0196079 A1 Oct. 7, 2004

Related U.S. Application Data

(62) Division of application No. 10/251,873, filed on Sep. 23, 2002, now Pat. No. 6,778,114.

(30) Foreign Application Priority Data

May 6, 2002 (KR) .................................. P2002-0024738

(51) Int. Cl.[7] .............................................. H03L 7/06
(52) U.S. Cl. ...................................... 327/158; 327/160
(58) Field of Search ................................ 327/149, 151, 327/152, 158, 160, 161

(56) References Cited

U.S. PATENT DOCUMENTS

| | | | |
|---|---|---|---|
| 3,573,797 A | 4/1971 | Kopelson | 341/42 |
| 4,795,314 A | 1/1989 | Prybella et al. | 417/43 |
| 6,215,726 B1 * | 4/2001 | Kubo | 365/233 |
| 6,424,199 B2 * | 7/2002 | Taguchi et al. | 327/292 |
| 6,680,634 B1 | 1/2004 | Ruha et al. | 327/158 |

* cited by examiner

Primary Examiner—Timothy P. Callahan
Assistant Examiner—Cassandra Cox
(74) Attorney, Agent, or Firm—Harness, Dickey & Pierce, P.L.C.

(57) ABSTRACT

A delay-locked loop (DLL) may include: a variable delay line arrangement operable to receive a reference clock and to output a delayed local clock; a phase comparator device operable to compare said reference clock and said local clock and to provide an up/down indication; and a delay control circuit, responsive to said up/down count-indication, to provide a reduced-noise delay control signal to said variable delay line arrangement, said delay control circuit being operable to count said up/down indication using an escalator code arrangement.

8 Claims, 25 Drawing Sheets

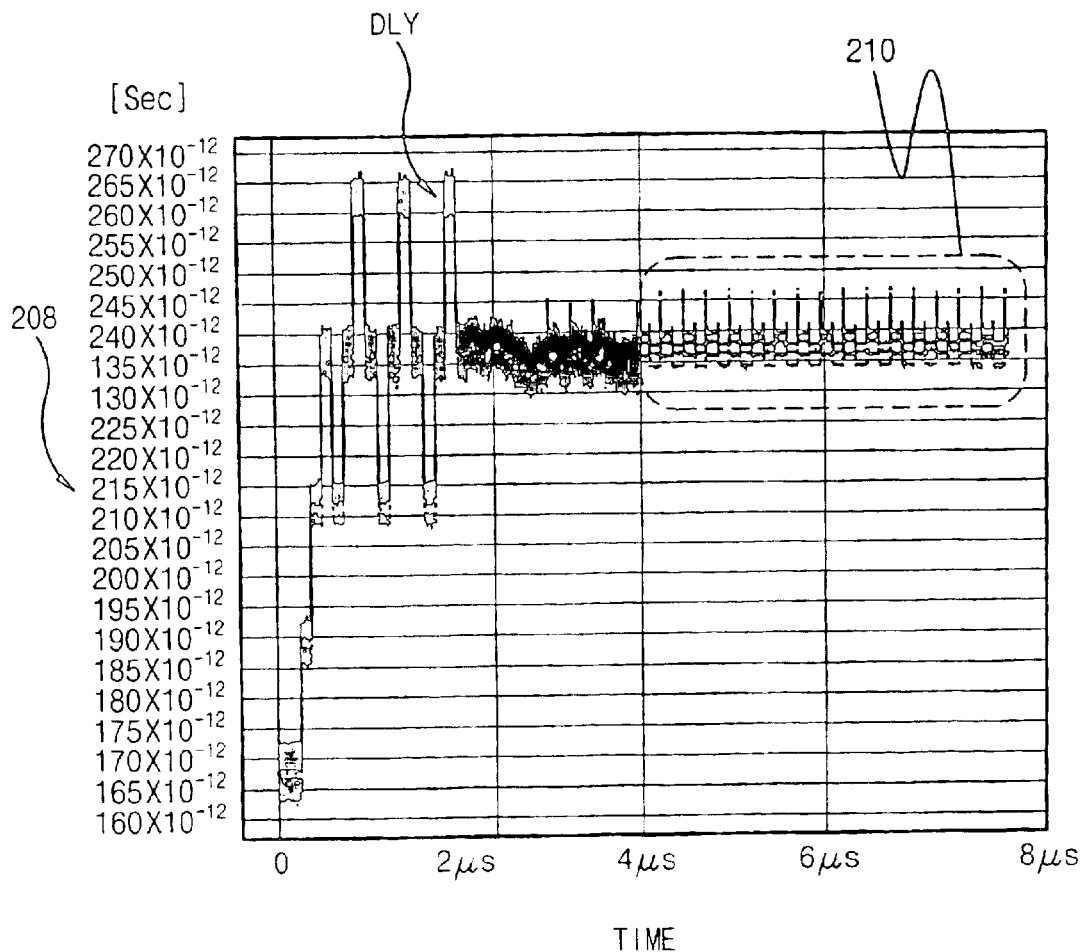

Fig. 2B (Background Art)

| DEC | <-MSB | | Binary | | | LSB-> |
|---|---|---|---|---|---|---|
| | B5 | B4 | B3 | B2 | B1 | B0 |
| $30_{10}$ | 0 | 1 | 1 | 1 | 1 | 0 |
| $31_{10}$ | 0 | 1 | 1 | 1 | 1 | 1 |
| $32_{10}$ | 1 | 0 | 0 | 0 | 0 | 0 |
| $33_{10}$ | 1 | 0 | 0 | 0 | 0 | 1 |
| $34_{10}$ | 1 | 0 | 0 | 0 | 1 | 0 |
| $33_{10}$ | 1 | 0 | 0 | 0 | 0 | 1 |
| $32_{10}$ | 1 | 0 | 0 | 0 | 0 | 0 |
| $31_{10}$ | 0 | 1 | 1 | 1 | 1 | 1 |
| $30_{10}$ | 0 | 1 | 1 | 1 | 1 | 0 |

Fig. 4A (Background Art)

| | | | | | $2_{10}$ | $1_{10}$ |
|---|---|---|---|---|---|---|
| | $4_{10}$ | $4_{10}$ | $4_{10}$ | $4_{10}$ | $2^1$ | $2^0$ |
| DEC | b3 | b2 | b1 | b0 | C1 | C0 |
| 0 | 0 | 0 | 0 | 0 | 0 | 0 |
| 1 | 0 | 0 | 0 | 0 | 0 | 1 |
| 2 | 0 | 0 | 0 | 0 | 1 | 0 |
| 3 | 0 | 0 | 0 | 0 | 1 | 1 |
| 4 | 0 | 0 | 0 | 1 | 0 | 0 |
| 5 | 0 | 0 | 0 | 1 | 0 | 1 |
| 6 | 0 | 0 | 0 | 1 | 1 | 0 |
| 7 | 0 | 0 | 0 | 1 | 1 | 1 |
| 8 | 0 | 0 | 1 | 1 | 0 | 0 |
| 9 | 0 | 0 | 1 | 1 | 0 | 1 |
| 10 | 0 | 0 | 1 | 1 | 1 | 0 |
| 11 | 0 | 0 | 1 | 1 | 1 | 1 |
| 12 | 0 | 1 | 1 | 1 | 0 | 0 |
| 13 | 0 | 1 | 1 | 1 | 0 | 1 |
| 14 | 0 | 1 | 1 | 1 | 1 | 0 |
| 15 | 0 | 1 | 1 | 1 | 1 | 1 |
| 16 | 1 | 1 | 1 | 1 | 0 | 0 |
| 17 | 1 | 1 | 1 | 1 | 0 | 1 |
| 18 | 1 | 1 | 1 | 1 | 1 | 0 |
| 19 | 1 | 1 | 1 | 1 | 1 | 1 |

Fig. 6A
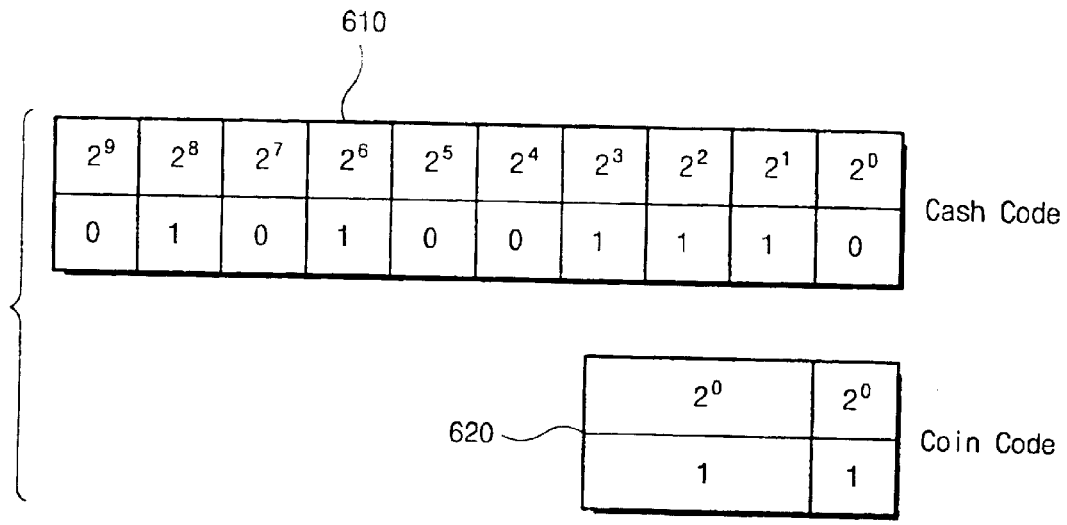
Fig. 6B
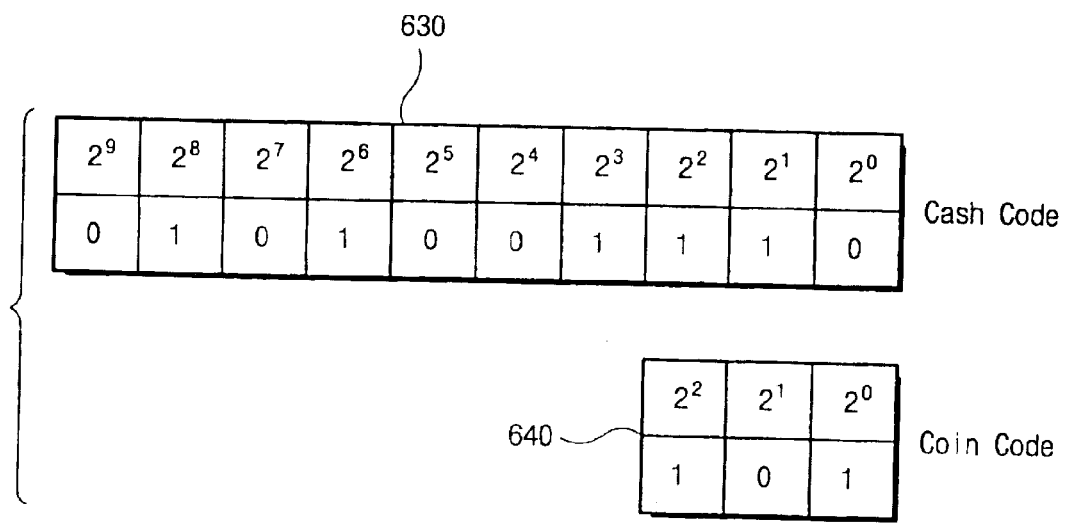
Fig. 6C
$32_{10} = 011110[32] + 00[0]$
$32_{10} = 011100[30] + 11[2]$
$32_{10} = 011101[31] + 01[1]$
　　　　　　　　　　Cash Code　　　Coin Code

* Coin Code Magnitude
** Time, t

Fig. 7D

| | | | | ↓ 730 | ↓ 731 | ↓ 732 | ↓ 734 | ↓ 736 | ↓ 738 | ↓ 740 |
|---|---|---|---|---|---|---|---|---|---|---|
| $1_{10}$ | $2^0$ | B0 | · · · | 0 | 0 | 1 | 0 | 0 | 0 | 0 | 0 |
| $2_{10}$ | $2^1$ | B1 | · · · | 1 | 1 | 1 | 0 | 0 | 0 | 0 | 0 |
| $4_{10}$ | $2^2$ | B2 | · · · | 1 | 1 | 1 | 0 | 0 | 0 | 0 | 0 |
| $8_{10}$ | $2^3$ | B3 | · · · | 1 | 1 | 1 | 0 | 0 | 0 | 0 | 0 |
| $16_{10}$ | $2^4$ | B4 | · · · | 1 | 1 | 1 | 0 | 0 | 0 | 0 | 1 |
| $32_{10}$ | $2^5$ | B5 | · · · | 0 | 0 | 0 | 1 | 1 | 1 | 1 | 0 |
| $64_{10}$ | $2^6$ | B6 | · · · | 0 | 0 | 0 | 0 | 0 | 0 | 0 | 1 |
| $1_{10}1_{10}$ | | S1S0 | · · · | 01 | 11 | 11 | 11 | 01 | 00 | 01 | 11 | 01 |
| | | DEC | · · · | 31 | 32 | 33 | 34 | 33 | 32 | 33 | 34 | 33 |

DLL=Delay Locked Loop

US 6,847,242 B2

ESCALATOR CODE-BASED DELAY-LOCKED LOOP APPARATUS AND CORRESPONDING METHODS

RELATED APPLICATIONS

This application is a divisional of application Ser. No. 10/251,873, filed on Sep. 23, 2002, now U.S. Pat. No. 6,778,114 the entire contents of which are hereby incorporated by reference and for which priority is claims under 35 U.S.C. 120; and this application relies for priority upon Korean Patent Application No. 2002-0024738, filed on May 6, 2002, the contents of which are hereby incorporated by reference in their entirety.

FIELD OF THE INVENTION

The invention is directed toward the field of digital-to-analog converters (DACs) and delay-locked-loops (DLLs), and more particularly to DACs and DLLs based upon an escalator code.

BACKGROUND OF THE INVENTION

Recent integrated circuits attached to a printed circuit board (PCB) e.g., synchronous DRAM (SDRAM). RAMBUS DRAM, etc. include a delay-locked-loop (DLL) circuit. The DLL circuit maintains a predetermined phase relationship between an internal clock and an external reference or system clock, e.g., supplied by a memory controller.

In its simplest form, a DLL has a programmable delay line and some control logic. The delay line produces a delayed version of the reference clock signal. The delayed clock signal is provided to the other internal circuitry of the integrated circuit, e.g., the DRAM integrated circuit (IC), of which the DLL is a part. In addition to being provided to the other internal circuitry of the IC, the internal clock signal is also fed back to delay control logic of the DLL. The delay control logic compares the clock signal which has been fed back against the reference clock signal in order to adjust an amount of delay to be caused by the programmable delay line.

FIG. 1A depicts a DLL according to the Background Art. The DLL 100 receives a reference clock, REFCLK, which is provided to a variable delay line 110. The delayed clock signal, CLKOUT, is output to the remaining circuitry of the IC (not shown). The output clock signal CLKOUT is also fed back via replica delay unit 140 as signal FBCLK to a phase comparator 130, which also receives the reference clock REFCLK. The phase comparator 130 provides an up/down-count signal to a delay control circuit (DCC) 120. The DCC 120 includes a counter 122 which provides an N-bit output to an N-bit digital-to-analog converter (DAC). The DAC 121, and therefore the DCC 120, outputs a delay adjustment signal DLYADJ to the variable delay line 110.

The function of the DLL 100 is to achieve a predetermined amount of phase difference between the reference clock signal REFCLK and the output clock signal CLKOUT. For the sake of simplicity, the operation of the DLL 100 will be explained under the assumption that the amount of predetermined delay is 360° or one cycle. The operation of the DLL 100 will now be discussed in terms of the waveforms of FIG. 1B. In FIG. 1B, a waveform of the reference clock REFCLK is plotted. Below the REFCLK waveform, the feedback clock FBCLK waveform is plotted. As expected, the feedback clock FBCLK is delayed in phase, i.e., shifted to the right, relative to the reference clock REFCLK waveform. Recalling that the predetermined phase is assumed to be one cycle, arrows 160–168 have been provided to emphasize the delay between the rising edges of the feedback clock FBCLK waveform and the rising edges of the next respective cycle in the reference clock REFCLK waveform. Inspection of FIG. 1B reveals that the effect of the DLL 100 is to shorten the delays indicated by the arrows 160–168.

The up-count waveform and down-count waveform of the phase comparator 130 are also depicted in FIG. 1B. Each of the arrows 160–168 indicates that additional delay is needed, albeit in lesser amounts for waveform 160 through waveform 168. Hence, the durations of the square pulses 170–178 in the up-count waveform diminish from pulse 170 through pulse 178.

The phase magnitude between the feedback clock signal FBCLK in the reference clock signal REFCLK is also plotted in FIG. 1B. Inspection of the phase (PH) waveform reveals that the magnitude of the phase difference decreases with the progression through the pulses 170–178, as indicated by upward arrows 180–188. Similarly, the delay adjust DLYADJ output by the N-bit DAC 121 increases inversely proportionally to the decrease in the phase difference. Similarly, the delay waveform, namely the waveform describing how close to a full cycle is the delay, decreases from left to right in correspondence to the decrease exhibited by the arrows 180–188 of the phase PH waveform.

The DAC 121 can be implemented in a number of ways. As simple implementation is to assign binary weighting to the individual transistors within the DAC 120. FIG. 3 is a schematic block diagram of a binary-weighted DAC 300 according to the Background Art. The DAC 300 includes four 1-bit converters 302, 306, 310 and 314, which reflects an assumption of a 4-bit weighting system (the number four is chosen for simplicity; typical DACs involve more bits). The 1-bit converter 302 includes an output transistor 322 having a channel whose width-to-length (W/L) ratio is such that it produces a unit current of magnitude, i. The 1-bit converter 306 has an output transistor 324 whose channel has a width-to-length ratio of 2 W/L that can sink a current of magnitude to 2i, i.e., twice that of the converter 302. The 1-bit converter 310 has an output transistor 326 whose channel width-to-length ratio is 4 W/L, which can sink a current of magnitude 4i. And the 1-bit converter 314 has an output transistor 328 whose channel width-to-length ratio is 8 W/L, which can sink a current of magnitude 8i.

A binary system, like any positional number system, represents a number based upon the combination of individual bits, where each bit represents a sub-value based upon its relative position and whether it is in the zero state or the one state. A 4-bit binary number has bits $b_3$ $b_2$ $b_1$ $b_0$, where $b_0=2^0=1$, $b_1=2^1=2$, $b_2=2^2=4$ and $b_3=2^3=8$, i.e., $b_3=8b1$, $b2=4b1$ and $b2=2b1$. Inspection of the 1-bit converters 314, 310, 306 and 302 reveals that their respective currents reflect a binary weighting for a 4-bit binary number.

The DAC 300 further includes a buffer 320. One output 318 of the buffer 320 is connected to the inputs 304, 308, 312 and 316 of the 1-bit converters 302, 306, 310 and 314, respectively. Based upon the control signals applied to each of the 1-bit converters, namely b0 and b0*b* for converter 302, b1 and b1*b* for converter 306, b2 and b2*b* for converter 310, and b3 and b3*b* for converter 314, each of the 1-bit converters is selectively turned on or off. When turned on, each 1-bit converter sinks its respective current. If all of the transistors are turned on, they collectively draw the sum of their individual currents out of the buffer 320 on the output line 318. Similarly, the second output line 321 of the buffer 320 outputs the same amount of current as is drawn out of the output line 318. The current on the second output line 321 represents the delay adjust signal DLYADJ.

FIG. 2A is a depiction of an example amount of delay between the clock output CLKOUT of the DLL 100 and the reference clock REFCLK. Inspection of the waveform DLY reveals that it is a typical damping curve that settles down to a predetermined amount of delay 208. It is to be noted that the output clock CLKOUT is an analog signal that can vary continuously. In contrast, the delay control circuit (DCC) 120 is a digital device that translates the up/down control signal from the phase comparator 130 into a binary-weighted word. Due to a variety of reasons, e.g., thermal fluctuation, system voltage fluctuations, noise, etc., there will be some oscillation or jitter 210 in the delay waveform DLY even after the DLL has achieved a locked state, i.e., after the waveform DLY settles at the predetermined amount of delay 208. This jitter 210 falls within a range of values 220. The locked status of the DLL 100 is shown as being achieved after 4 μsec.

FIG. 2B is a depiction of 6-bit binary words and their decimal equivalent. To simplify the explanation, it is assumed that the jitter 210 corresponds to the count values $31_{10}$ and $32_{10}$ output by the counter 122. In other words, it is assumed that the count values corresponding to the jitter 210 are $31_{10}$ and $32_{10}$. Inspection of FIG. 2B reveals that the transition from $31_{10}$ to $32_{10}$ involves a state change in each of the bits b0–b5. As the count value cycles (or jitters) between $31_{10}$ an $32_{10}$, each of the bits b0–b5 repeatedly change back and forth between a state of zero and a state of one.

When any of the bits in the count output by the counter 122 changes from one to zero or from zero to one, current either stops flowing or begins to flow through the corresponding transistor(s) of the respective 1-bit converter. If only the transistor corresponding to the least significant bit turns on or off, the difference in current can be negligible. But if all of the transistors change their conduction station, as in the transition from $31_{10}$ to $32_{10}$ or $32_{10}$ back to $31_{10}$ show in FIG. 2B, then large amounts of current are involved.

FIG. 2C depicts current amounts for a theoretical situation in which all of the transistors turn on or off, respectively, i.e., a multi-bit transition. There, the x-axis corresponds to time and the y-axis corresponds to current. Line 240 depicts the total current that switches off at the multi-bit transition time 246 while line 242 plots the total current that switches on at the transition time or point 246. Line 244 plots the summation of lines 240 and 242. In this theoretical condition, the amount of current turning off substantially equals the amount of current turning on, hence there is little to no change in the total amount of current involved.

FIG. 2D plots realistic values for the current amounts associated with the multi-bit transition point 246. Line 246 corresponds to line 240 in that it depicts the total amount of current being switched off at the multi-bit transition point 246. Line 250 corresponds to line 242 in that it plots the total amount of current being turned on at the multi-bit transition point 246. Inspection of lines 248 and 250 reveal that their transitions are very gradual in comparison to the abrupt transitions of theoretical lines 240 and 242. Line 252 corresponds to line 244 in that it plots the summation of the current represented by lines 248 and 250. Inspection of line 252 reveals that there is a significant decrease in the total current associated with the multi-bit transition point 246. This is a sharp contrast to the essentially flat line 244 of the corresponding theoretical situation.

The large change in total current passing through the DAC 121 during a multi-bit transition, as exhibited by the line 252 of FIG. 2D, generates a great deal of noise in the integrated circuit. This is a problem. When the DAC 121 is forced to cycle repeatedly through a multi-bit transition, e.g., from $31_{10}$ to $32_{10}$ and $32_{10}$ back to $31_{10}$, the problem is significantly worsened.

The Background Art attempted to deal with this problem by basing the digital-to-analog converter (DAC) 121 on a different code rather than the simple binary-weighted code. In particular, a hybrid of a binary-weighted code and a thermometer code was adopted. In the hybrid code, a number is represented in part by a binary-weighted code and in part by a thermometer code. In a thermometer code, each bit represents a predetermined decimal value.

FIG. 4A is a table of an example hybrid thermometer/binary code. There the least significant bits correspond to the binary code portion, namely bits $c_0$ and $c_1$. The more significant bits are represented by the thermometer code portion, namely bits $b_0$, $b_1$, $b_2$ and $b_4$. The hybrid code of FIG. 4A assumes, for simplicity, a situation in which it is only desired to represent a maximum of $19_{10}$.

Inspection of the rows in FIG. 4A corresponding to the numbers $0_{10}$–$3_{10}$ reveals that the thermometer code has all zero values while the binary code portion exhibits a typical binary progression. At the number $4_{10}$, the binary code portion resets to zero while the b0 bit of the thermometer code takes on a value of one while bits b1–b3 remain at zero. Inspection of the progression from $4_{10}$–$7_{10}$ reveals that the binary code portion increments again through the normal binary progression while the thermometer code portion remains the same. At the number $8_{10}$, however, the binary code portion resets to zero while the b1 bit of the thermometer code takes a value of one. Inspection of the progression from $8_{10}$ through $11_{10}$ again reveals that the binary code portion undergoes the normal binary progression while the thermometer code portion remains the same. At the number $12_{10}$, the binary code portion resets while the 2 bit of the thermometer code portion changes to a value of one.

FIG. 4B is a schematic block diagram of a circuit for generating the hybrid code of FIG. 4A, according to the Background Art. Up/down count signals (from the comparator 130) are received by a 4-bit counter 410. The upper two most significant bits c3, c2 are provided to a thermal decoder 420, which outputs a 4-bit thermometer code b3*b2b1b*0.

FIG. 4C is a schematic block diagram for a DAC 430 (according to the Background Art) based upon the hybrid code of FIGS. 4A–4B. The DAC 430 includes six 1-bit converters $431_1$, $431_2$, $431_3$, $431_4$, $432_1$ and $432_2$. The 1-bit converter $432_1$ has a W/L ratio that can be considered to produce a unit current having a magnitude known as i. Consistent with a binary weighting, the 1-bit converter has a ratio of 2W/L for a current capacity of 2i. The four 1 bit converters $431_1$–$431_4$ each have the same ratio, namely 4W/L for a current capacity of 4i. The converters $432_1$ and $432_2$ receive the outputs c0–c1, respectively. The converters $431_1$–$431_4$ receive the outputs b0–b2, respectively.

In terms of multi-bit transitions, the hybrid code of FIG. 4A exhibits a worst-case scenario at the transitions between $3_{10}$ and $4_{10}$, $7_{10}$ and $8_{10}$, $11_{10}$ and $12_{10}$, and $15_{10}$ and $16_{10}$. But it is to be noticed that only 3-bits change during those transitions, namely the binary code bits $c_0$ and $c_1$ and only one of the thermometer code bits. Consequently, the DAC based upon the hybrid code exhibits a much smaller change in total current during a multi-bit transition than does the purely binary-coded type of DAC. This is an advantage conferred by the thermometer code aspect of the hybrid code.

But the thermometer code aspect also confers some disadvantages. In order to keep the binary code portion to a relatively small number of bits, each bit of the thermometer code can be represent a relatively small decimal equivalent. In the example of FIG. 4, each bit of the thermometer code portion represents the number $4_{10}$, which corresponds to $2_2$. Consequently, in the hybrid code of FIG. 4A, the binary code portion is kept to a mere two binary bits c0 and c1. If the binary code portion were increased to 3-bits so that the most significant bit in the binary code portion had a value representing $2^2=4_{10}$, then each bit in the thermometer code would represent the next higher power of 2, namely $2^3=8_{10}$.

This relationship is important because the number of thermometer code bits needed to represent a particular value increases as the decimal equivalent represented by each thermometer bit decreases. In the example of FIG. 4A, the hybrid code could represent only a maximum of $19_{10}$. This is a small number and yet it requires a 4-bit thermometer code. As such, a problem with using the thermometer code is that it typically requires a great many bits to represent a reasonably large number. Consequently, the corresponding transistor circuitry consumes a great deal of surface area on an integrated circuit and its wiring significantly complicates the architecture of the DAC of which it is a part.

SUMMARY OF THE INVENTION

At least one embodiment of the present application provides a delay-locked loop (DLL). Such a DLL may include: a variable delay line arrangement operable to receive a reference clock and to output a delayed local clock; a phase comparator device operable to compare said reference clock and said local clock and to provide an up/down indication; and a delay control circuit, responsive to said up/down count-indication, to provide a reduced-noise delay control signal to said variable delay line arrangement, said delay control circuit being operable to count said up/down indication using an escalator code arrangement.

Additional features and advantages of the invention will be more fully apparent from the following detailed description of example embodiments, the appended claims and the accompanying drawings.

BRIEF DESCRIPTION OF THE DRAWINGS

The accompanying drawings are: intended to depict example embodiments of the invention and should not be interpreted to limit the scope thereof; and not to be considered as drawn to scale unless explicitly noted.

FIG. 2A is a plot depicting the progression toward and settling into of a locked state by the DLL of FIG. 1A according to the Background Art.

FIG. 2B is a table depicting an example set of binary code values corresponding to the locked condition depicted in FIG. 2A according to the Background Art.

FIG. 4A is a table listing a bit values for a progression from $0_{10}$ through $19_{10}$ for the hybrid code corresponding to FIG. 4A.

FIGS. 6A–6B are tables illustrating an example of an escalator code according to an embodiment of the invention.

FIG. 6C depicts another example of an escalator code according to an embodiment of the invention.

FIG. 7D is a table illustrating changes in bit values for an example escalator code according to an embodiment of the invention.

Detailed Description of Example Embodiments

Figure 1A:
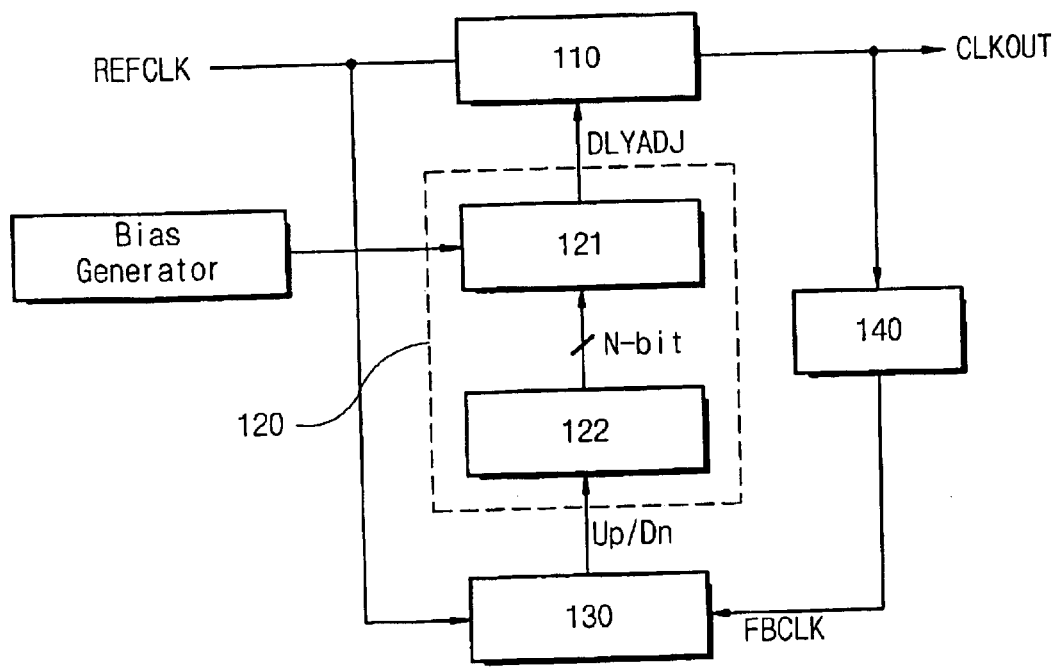
FIG. 1A is a schematic block diagram of a delay-locked loop (DLL) according to the Background Art.
Figure 1B:
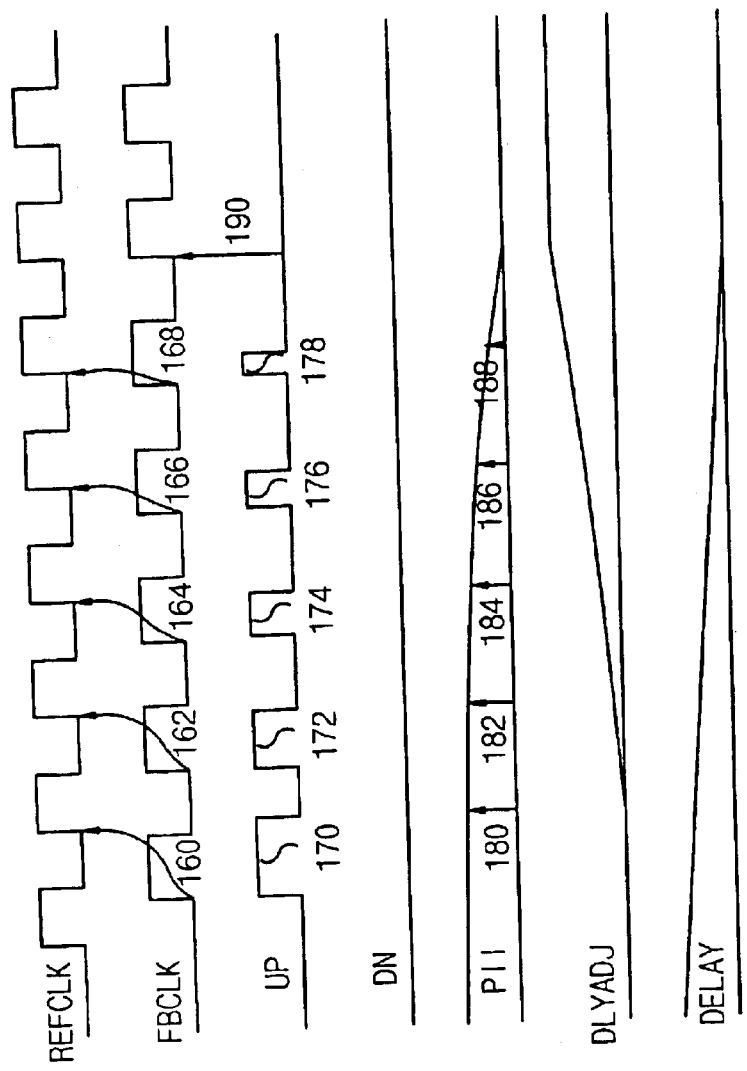
FIG. 1B is a set of waveforms depicting the operation of the DLL of FIG. 1 according to the Background Art.

Operations of a counter device, according to an embodiment of the invention include: representing base N numbers with a mixed code having a non-N-based coin code portion and a non-N-based cash code portion, said coin code corresponding to one or more of the least significant bits of said cash code but fewer than all bits of said cash code, said coin code portion of said mixed code representing a range of base N numbers, the range having an upper boundary and a lower boundary; determining, if a trigger signal is for upcounting, whether a previously attained value of said coin code portion equals said upper boundary value; upcounting, if it was determined that said previously attained value of said coin code portion Is less than said up-count boundary value, using said coin code portion; upcounting, if it was determined that said previously attained value of said coin code portion equals said upper boundary value, using said cash code portion; determining, if said trigger signal is for downcounting, whether said previously attained value of said coin code portion equals said lower boundary value; downcounting, if it was determined that said: previously attained value of said coin code portion is greater than said second boundary value, using said coin code portion; and downcounting, if it was determined that said previously attained value of said coin code portion equals said lower boundary value, using said cash code portion; wherein a change in counting direction is manifested as an alteration in the value of said coin code portion while the value of said cash code portion is kept the same.

For example, the variable N can be 10. Such a coin code can be, e.g., a thermometer code or a binary code and such a cash code can be, e.g., a binary code.

Operations of a counter device, according to an embodiment of the invention, include: representing base N numbers with a mixed code having a non-N-based coin code portion and a non-N-based cash code portion, said coin code corresponding to one or more of the least significant bits of said cash code but fewer than all bits of said cash code; counting by representing the count as a summation of the base N number represented by said coin code and the base N number represented by said cash code; changing directions of the count by altering said coin code until a counting capacity of said coin code is exceeded, said cash code being alterable after said counting capacity of said coin code is exceeded; and wherein cycling between adjacent base N numbers is manifested in the value of said coin code portion while keeping the value of said cash code portion the same.

Operations of a counter device, according to an embodiment of the invention, include: representing base N numbers with a mixed code having a non-N-based coin code portion and a non-N-based cash code portion, said coin code corresponding to one or more of the least significant bits of said cash code but fewer than all bits of said cash code; wherein a count is formed by summing the base N number represented by said coin code and the base N number represented by said cash code; attempting to count, in response to a trigger signal, using said coin code; upcounting with said cash code only when said coin code reaches an upper boundary; and downcounting with said cash code only when said coin code reaches a lower limit; wherein cycling between adjacent base numbers is manifested in said coin code portion while keeping said cash code portion the same.

Figure 5:
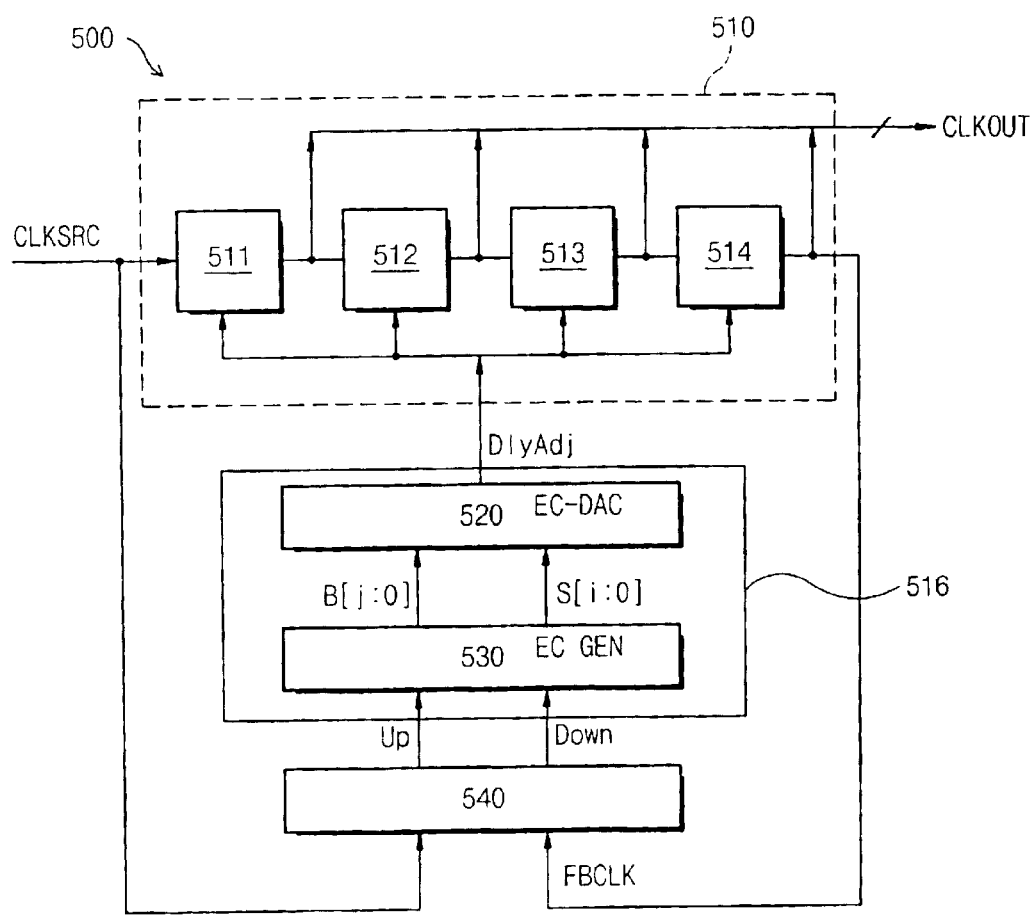
FIG. 5 is a schematic block diagram of a delay-locked loop (DLL) according to an embodiment of the invention.

FIG. 5 is a schematic block diagram of a delay-locked loop (DLL) circuit 500 according to an embodiment of the invention. The circuit 500 includes a well known variable delay line 510 having delay units 511, 512, 513 and 514. Greater or fewer delay units can be included; for simplicity, only four have been presented here. The circuit 500 further includes a phase detector/comparator 540 and a delay control circuit 516. Included within the delay control circuit 516 are an escalator code generator 530 and an escalator-coded digital-to-analog converter (DAC) 520.

The first delay unit 511 and the phase comparator 540 each receive the system clock signal CLKSRC. In a known manner, the delay units 511–514 are cascaded together with their outputs connected together to form the output clock signal CLKOUT. The output clock signal is fed back to the phase comparator 540 as feedback signal FBCLK. The comparator 540 outputs an up-count signal or a down-count signal depending upon whether the phase of the output clock CLKOUT is a ahead or behind the reference clock CLKSRC. The escalator code generator 530 counts, i.e., generates escalator codes, in response to the up/down signals from the phase comparator 540. As will be discussed in more detail below, the escalator code has a coin code portion, S[i:0], and a cash code portion, B[j:0], that are provided to the escalator-coded DAC 520. The DAC 520 provides a delay adjust signal DLYADJ in parallel to each of the delay units 511–514.

FIG. 6A has tables listing an example of an escalator code according to an embodiment of the invention. One of the tables (610) lists the cash code portion, which for the sake of a simple example takes the form of a 10-bit binary-weighted code. Example states of the respective bit positions have been indicated. The other table (620) lists an example 2-bit coin code as well as example states of the respective bit positions. The 2-bit coin code takes the form of a thermometer code. The escalator code of the FIG. 6A represents $336_{10}$ that is expressed as a combination of the cash code $334_{10}$ and the coin code $2_{10}$. The escalator code can express a decimal value in multiple ways according to the combination of the cash code and the coin code.

FIG. 6C shows an example of an escalator code that can express a decimal value in multiple ways. It is noted that the decimal equivalent to the binary code portions is shown enclosed in square ("[ ]") brackets in FIG. 6C. So in FIG. 6C, a decimal value 32 can be expressed three ways according to the combination of the cash code and the coin code.

FIG. 6B is similar to FIG. 6A except that the example coin code depicted is a 3-bit coin code that takes the form of a 3-bit binary-weighted code. Again in FIG. 6B, example states of the respective bit positions have been depicted. The escalator code of the FIG. 6B represents $339_{10}$ that is expressed as a combination of the cash code $334_{10}$ and the coin code $5_{10}$.

Figure 7A:
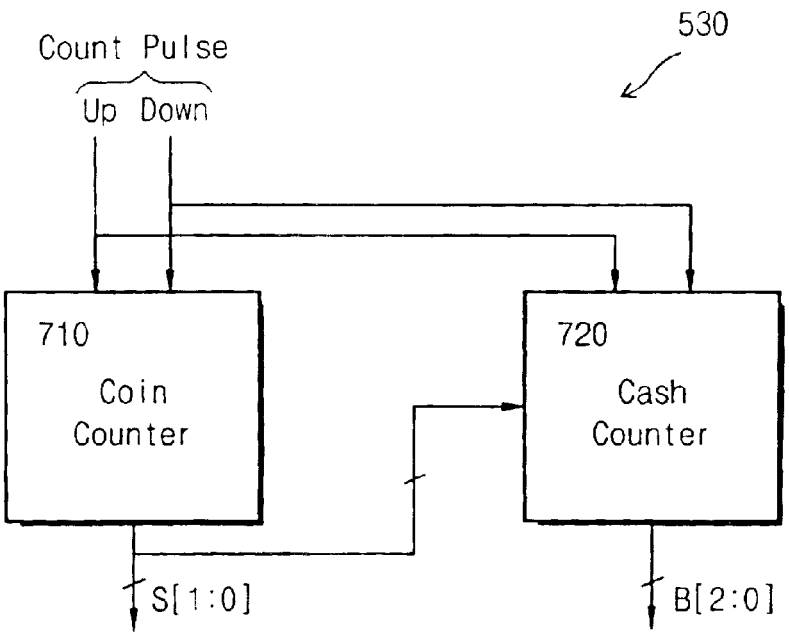
FIG. 7A is a schematic block diagram of an escalator code generator according to an embodiment of the invention.

FIG. 7A is a schematic block diagram of the escalator code generator 530 according to an embodiment of the invention. The generator 530 includes a coin counter 710 and a cash counter 720. In this embodiment, the coin counter can be a 2-bit stack memory and the cash counter can be a 3-bit binary counter. Other implementations of the coin counter and the cash counter can be used.

Each of the coin counter 710 and the cash counter 720 receive the up-count and down-count signals from the phase comparator 540. The coin counter 710 outputs the coin code, which for the sake of simplicity in FIG. 7A has been assumed to be 2-bits in length, namely S[1:0]. In addition to being provided to the DAC 520, the output of the coin counter 710 is provided to the cash counter 720. The cash counter 720 outputs the cash code, which for the sake of simplicity in FIG. 7A takes the example of a 3-bit code, namely B[2:0].

Figure 7B:
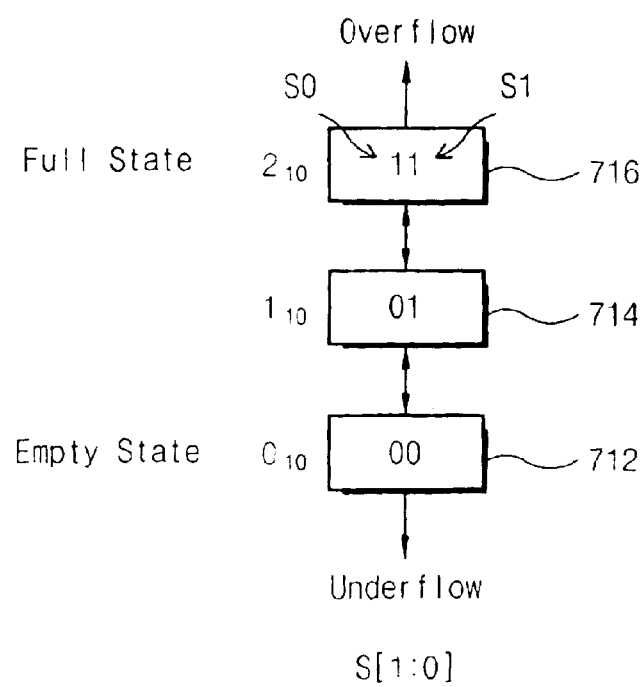
FIG. 7B is a state diagram corresponding to the coin counter of FIG. 7A.

FIG. 7B is a state diagram of the coin code output by the coin counter 710. In the embodiment of FIG. 7B, the coin code is a 2-bit thermometer code generated by the 2-bit stack memory. The operation of the coin counter 710 restricts the coin code to three states. Those states are illustrated in blocks 712, 714 and 716. Each of the coin code bits $S_0$ and $S_1$ represents a decimal equivalent of one.

Assuming that counting starts at zero, the output of the coin counter 710 is initially at state 00, as indicated by the box 712, which equals $0_{10}$. When the count is incremented, the output of the coin counter 710 becomes 01, as indicated by the box 714, which corresponds to $1_{10}$. Incrementing the count again causes the output of the coin counter 710 to become 11, as indicated by the box 716, which equals $2_{10}$. If the phase comparator 540 provides another up-count signal, the coin counter 710 does not change its output, i.e., the output remains as indicated by the box 716.

Figure 7C:
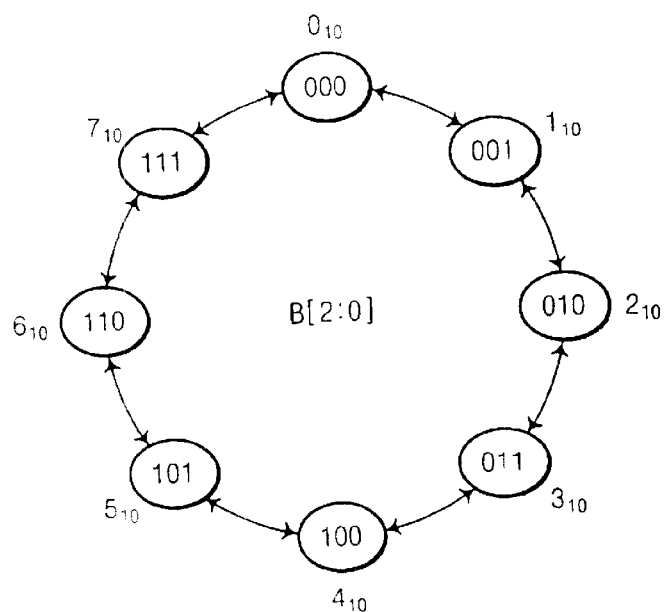
FIG. 7C is a state diagram corresponding to the cash counter of FIG. 7A.

Instead of the coin counter being overflowed, the cash counter correspondingly increments its output. FIG. 7C is a state diagram of the cash code output by the cash counter 720. Again assuming that counting starts at 0, the cash code initially takes the state 000 and keeps it during the first three counts corresponding to $0_{10}$, $1_{10}$ and $2_{10}$. But on the fourth count, when the coin counter overflows, the cash code increments to 001. In the example of FIG. 7C, the cash code takes the form of a binary-weighted code. If the phase comparator continues to provide up-count pulses to the counters 710 and 720, the coin counter 710 will remain in an overflow state and the cash counter will absorb the increment, progressing from the state 001 to the state 010 to the state 011 to the state 100, etc.

If a down-count pulse is provided by the phase comparator 540, then the change is initially absorbed by the coin code, not by the cash code. The state of the cash code would remain the same while the coin code decremented from state 716 down to state 714. If another down-count is received, then the coin code would again absorb the decrement, changing from the state 714 to the state 712. If yet another down-count is received, the coin counter would reach an underflow situation where it cannot decrement further. Accordingly, the coin code would remain in the state 712 while the decrement would be absorbed by the cash code, which is correspondingly decremented.

By establishing a relatively small upper boundary and a relatively small lower boundary, the bulk of the numeric representation can be handled by the cash code. Choosing the cash code to be a binary-weighted form significantly reduces: the number of 1-bit converters that are needed. Alternatively, other codes can be used for the cash counter. For example, a thermometer code can be used if it is more important to reduce the number of bits in transition during a worst case scenario for multi-bit transitions than is the factor of reducing IC surface area consumption.

The coin code also has the advantage that it, rather than the cash code, absorbs a change in counting direction. This is important, e.g., in a situation in which a DLL locks and yet exhibits some cycling due to jitter. The smaller transistors in the one-bit converters associated with the coin code, which absorbs the cycling, generate less noise than most of the transistors in the one-bit converters associated with the cash code.

FIG. 7D depicts a 9-bit escalator code according to an embodiment of the invention. The escalator code includes a 2-bit coin code and a 7-bit cash code. In this example, the cash code again takes the form of a binary-weighted code while the coin code takes the form of a simple binary code in which each bit position represents the same numeric value, e.g., 1. FIG. 7D illustrates a situation that is analogous to the situation illustrated in Background Art FIG. 2B (namely where cycling occurs around numeric values $31_{10}$ and $32_{10}$). In FIG. 7D, because of the extra two bits S1 corresponding to the cash code, which both represent $1_{10}$, the back and forth cycling around $31_{10}$ and $32_{10}$ in Background Art FIG. 2B corresponds to cycling in FIG. 7D between $33_{10}$ and $34_{10}$. The cycling situation illustrated in FIG. 7D differs from Background Art FIG. 2B in that this cycling is being handled by an escalator code according to an embodiment of the invention.

Again, the cycling happens because of jitter of a locked status of a DLL. The size of the coin code can be designed to absorb the jitter. Appropriate bit lengths for the coin code and the cash code depend upon the circumstances in which the escalator code is to be employed. As the range of the cycling increases, the corresponding number of bits in the coin counter can increase.

Assuming that the phase comparator has continually provided up-count signals, then the escalator code would have reached a state of $31_{10}$ corresponding to a coin code of 01 and a cash code of 001110. A subsequent up-count would increment the coin code to the state 11 and leave the cash code the same. A further increment to $33_{10}$ would leave the coin code the same, namely 11, and increment the cash code to the state 0011111. A further increment to $34_{10}$ would leave the coin code the same at 11 and increment the cash code to the state 0100000 as shown in row 731. The transition 730 from $33_{10}$ to $34_{10}$ is a multi-bit transition in the cash code. Should the next signal from the phase comparator 540 be a down-count, it is desired to prevent another multi-bit transition 730, e.g., because of the associated noise due to the change in states of the six output transistors of the respective one-bit converters.

Assuming that the next count signal from the phase comparator 540 is a decrement signal, the coin counter absorbs the decrement rather than the cash counter, taking the state 01 in row 732. If a decrement signal is then received, the decrement is again absorbed by the coin code, taking the state 00 in row 734. But if the next count signal from the phase comparator 540 is an up-count signal, the increment is still reflected by the coin code, taking state 01 as indicated in row 736. A further increment is again absorbed by the coin code, taking state 11 as indicated in row 738. But at this point, the coin code has reached its upper boundary. The immediately following increment would then be absorbed by the cash code.

Figure 2C:
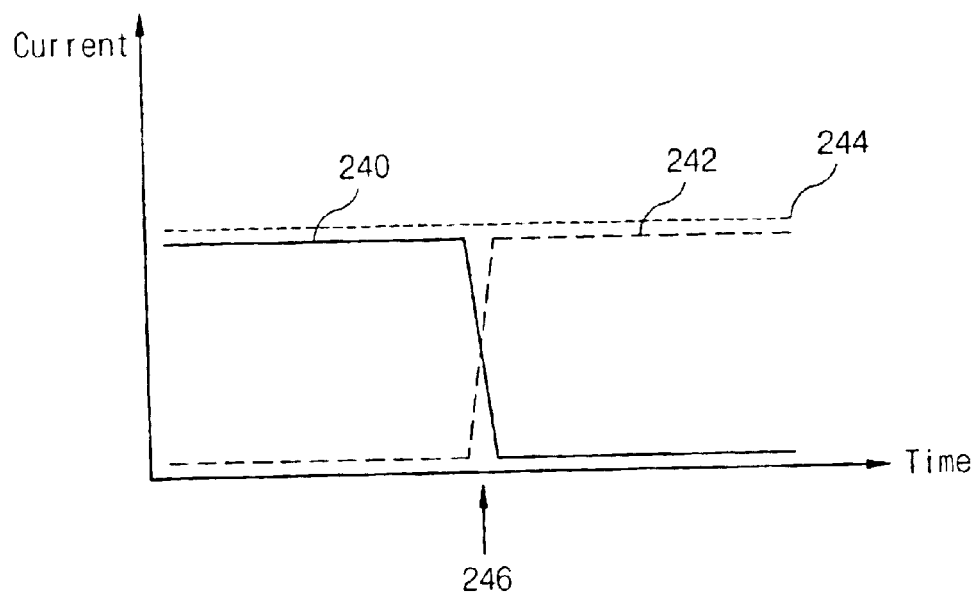
FIG. 2C plots current for the theoretical circumstance in which all output transistors of a binary-coded DAC according to the Background Art turn on or off.
Figure 2D:
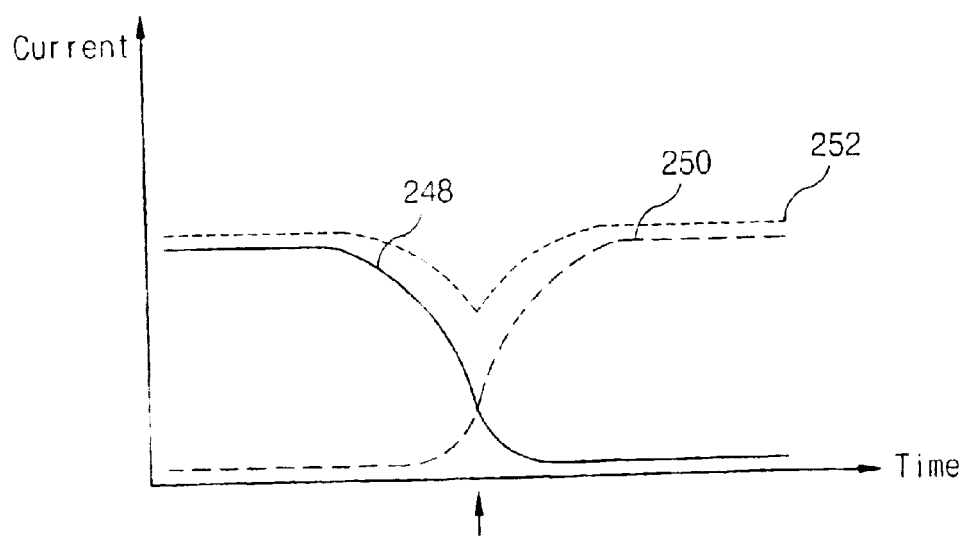
FIG. 2D is a plot of realistic currents according to the Background Art corresponding to theoretical currents of FIG. 2C.
Figure 3:
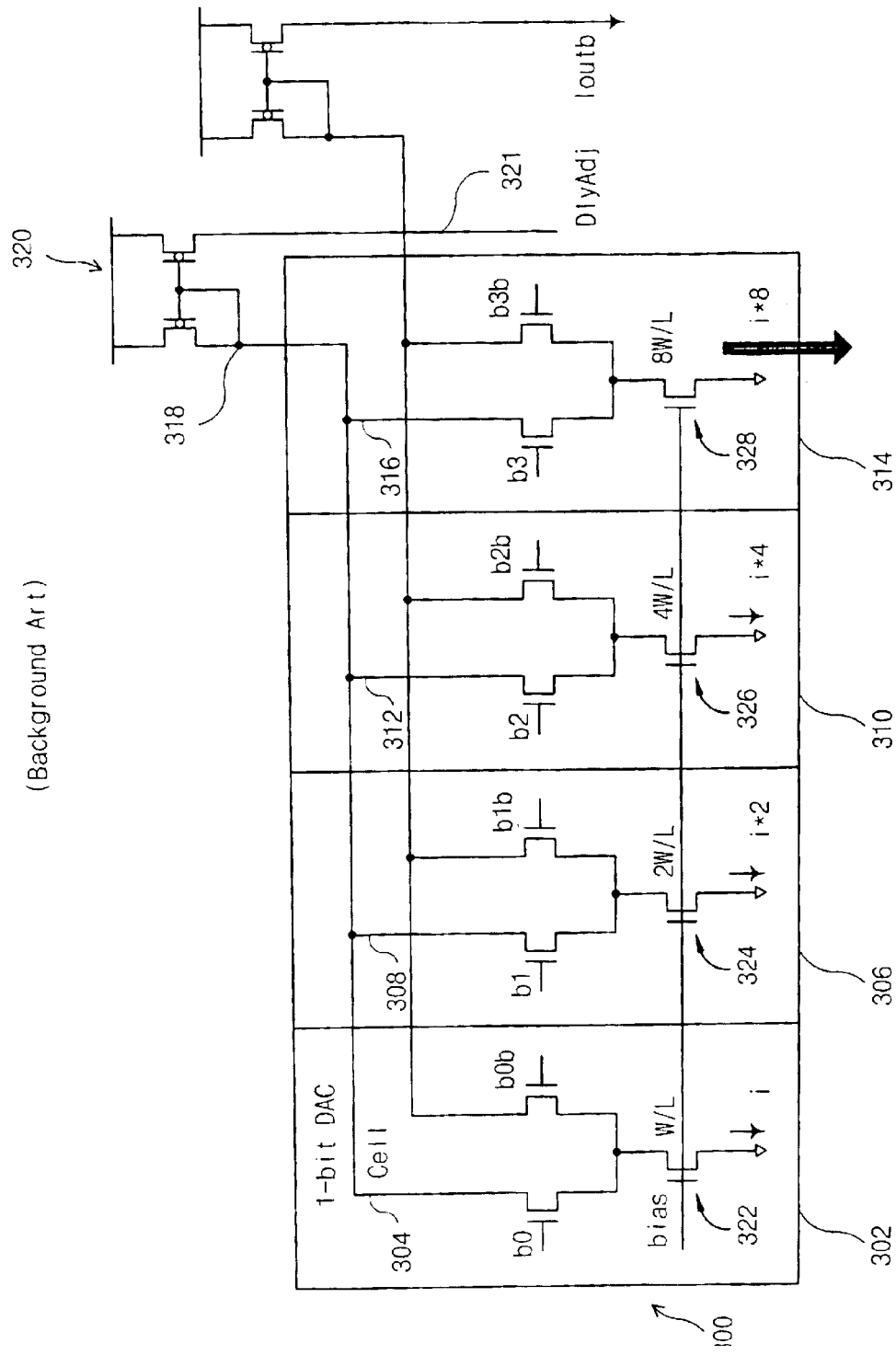
FIG. 3 is a transistor level diagram of a binary-weighted DAC 300 according to the Background Art.
Figure 4B:
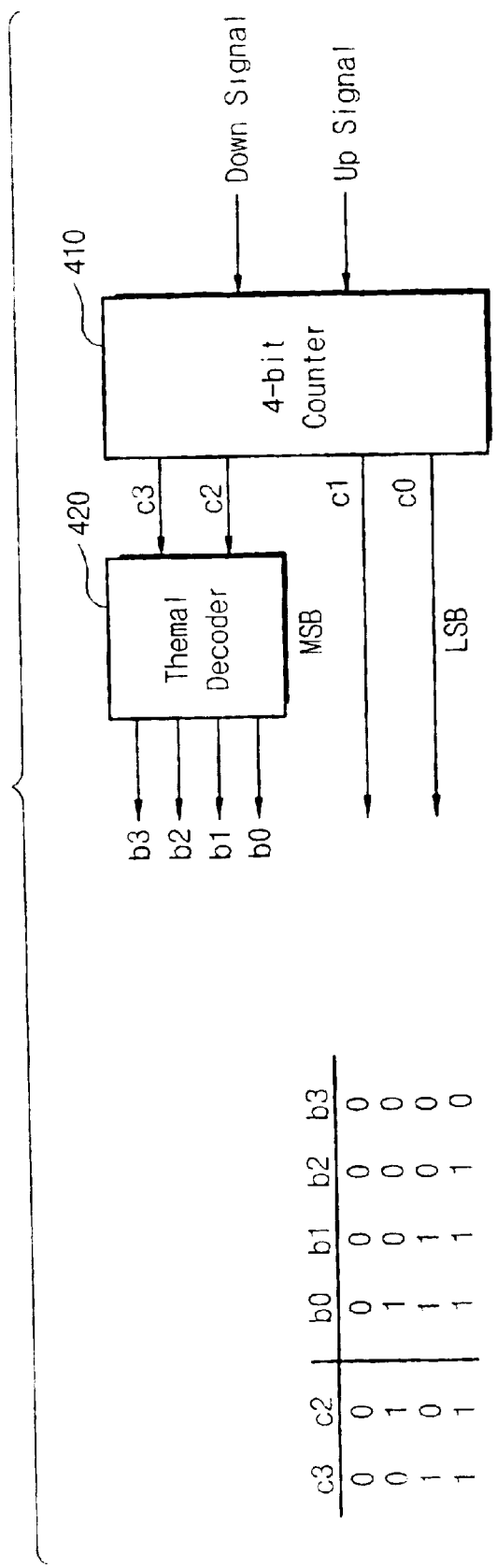
FIG. 4B is a schematic block diagram of a hybrid thermometer/binary code generator according to the Background Art that corresponds to the hybrid code of FIG. 4A.
Figure 4C:
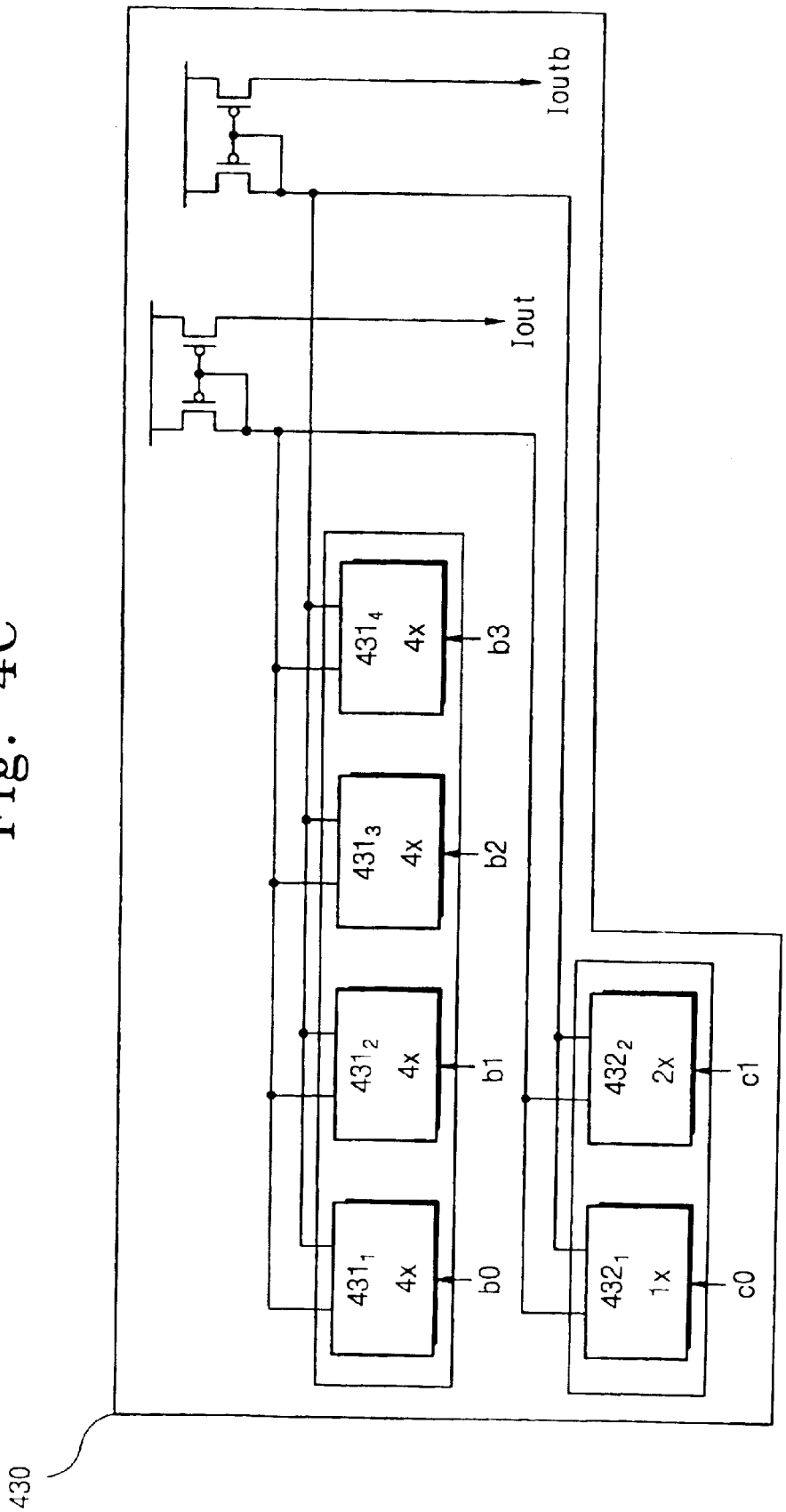
FIG. 4C is a schematic block diagram of a hybrid thermometer/binary code-based DAC according to the Background Art that corresponds to FIG. 4A.

However, if the subsequent count signal is a down-count, then the increment is absorbed by the coin code, taking the state 01 as indicated by row 740. Cycling between $33_{10}$ and $34_{10}$ is absorbed by transitions in the coin code rather than transitions in the cash code. This eliminates the repeated multi-bit transitions suffered by the corresponding Background Art DAC, as depicted in FIG. 2B.

Figure 7E:
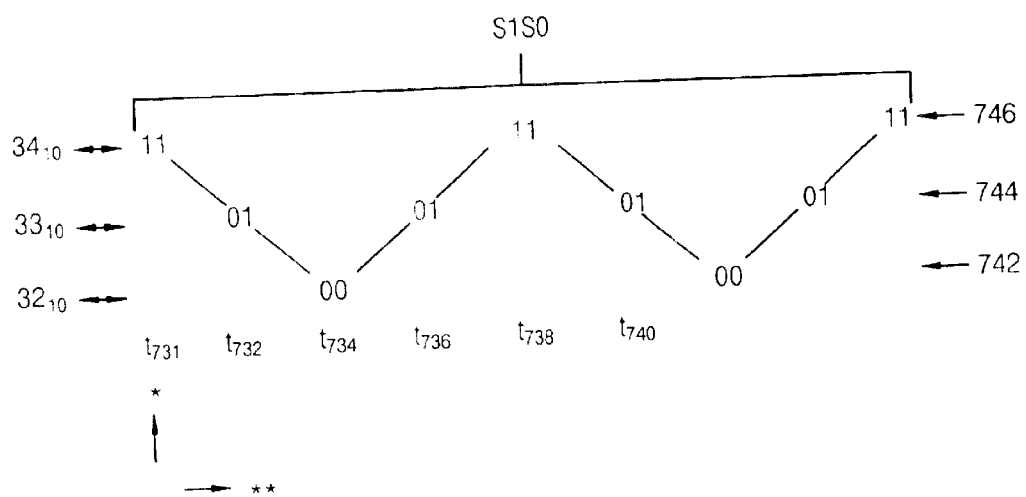
FIG. 7E is a table illustrating the cycling of FIG. 7D in more detail.

FIG. 7E is a chart depicting cycling (again, caused by jitter) between $34_{10}$ and $32_{10}$ and how it is absorbed by the coin code. FIG. 7E merely presents aspects of FIG. 7D>in more detail. In FIG. 7E, the x-axis corresponds to time and the y-axis corresponds to the magnitude of the number represented by the coin code. The bottom row 742 has the coin code state 00, corresponding to $32_{10}$. The middle row 744 has the coin code state 01, corresponding to $33_{10}$. And the top row 746 has the coin code state 11, corresponding to $34_{10}$. The time increments $t_{731}$, $t_{732}$, $t_{734}$ ... $t_{740}$ correspond to the states depicted in rows 731, 732, 734 ... 740, respectively. Inspection of FIG. 7E as a whole reveals that the cycling is absorbed entirely by the coin code.

Figure 8:
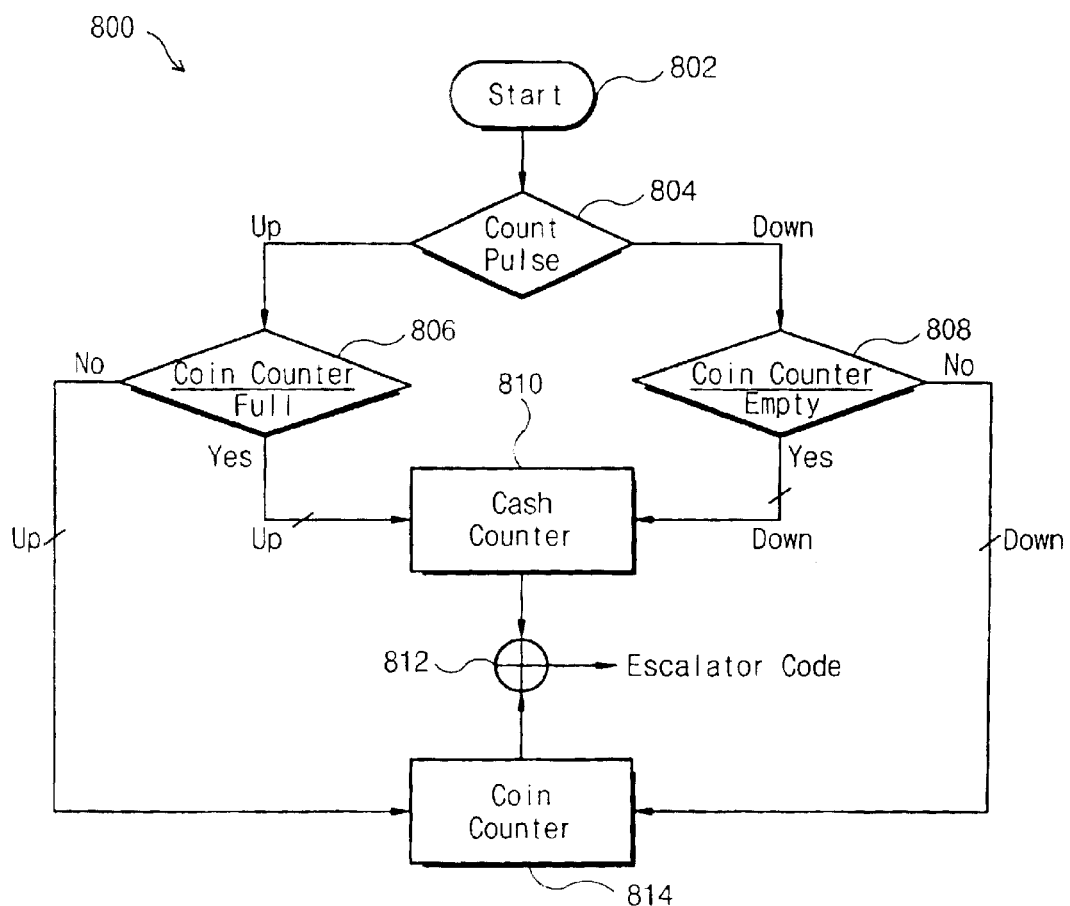
FIG. 8 is a flow chart of operations according to an embodiment of the invention.

FIG. 8 is a flow chart 800 according to an embodiment of the invention. Flow starts at block 802 and proceeds to decision block 804, where it is determined whether the count pulse from the phase comparator 540 is in an up-count or a down-count. If an up-count has been received, flow proceeds from block 804 to block 806, where it is determined whether the coin counter is full, i.e., whether the state of the coin code is currently at its upper boundary. If so, then flow proceeds to block 810, where the increment is absorbed by the cash counter, i.e., the cash counter is incremented. From block 810, flow proceeds to block 812, where the sum of the coin code and the cash code represents the numeric value of the escalator code.

But if it is determined at block 806 that the coin counter is not full, then flow proceeds to block 814, where the increment is absorbed by the coin counter, i.e., the coin counter is incremented. From block 814 flow proceeds to block 812, where the coin code and cash code are summed to provide the numerical equivalent of the escalator code.

Back at block 804, if it is determined that the count pulse is a down-count, then flow proceeds to block 808. At block 808, it is determined whether the coin code is empty, i.e., whether the coin counter is currently at its lower boundary. If so, then flow proceeds to block 810, where the decrement is absorbed by the cash code, i.e., the value in the cash code is decremented. As before, flow proceeds from block 810 to block 812. If, however, it is determined at block 808 that the coin code is not empty, then flow proceeds to block 814, where the coin code absorbs the decrement, i.e., the coin code is decremented. From block 814 flow proceeds to block 812.

Figure 9:
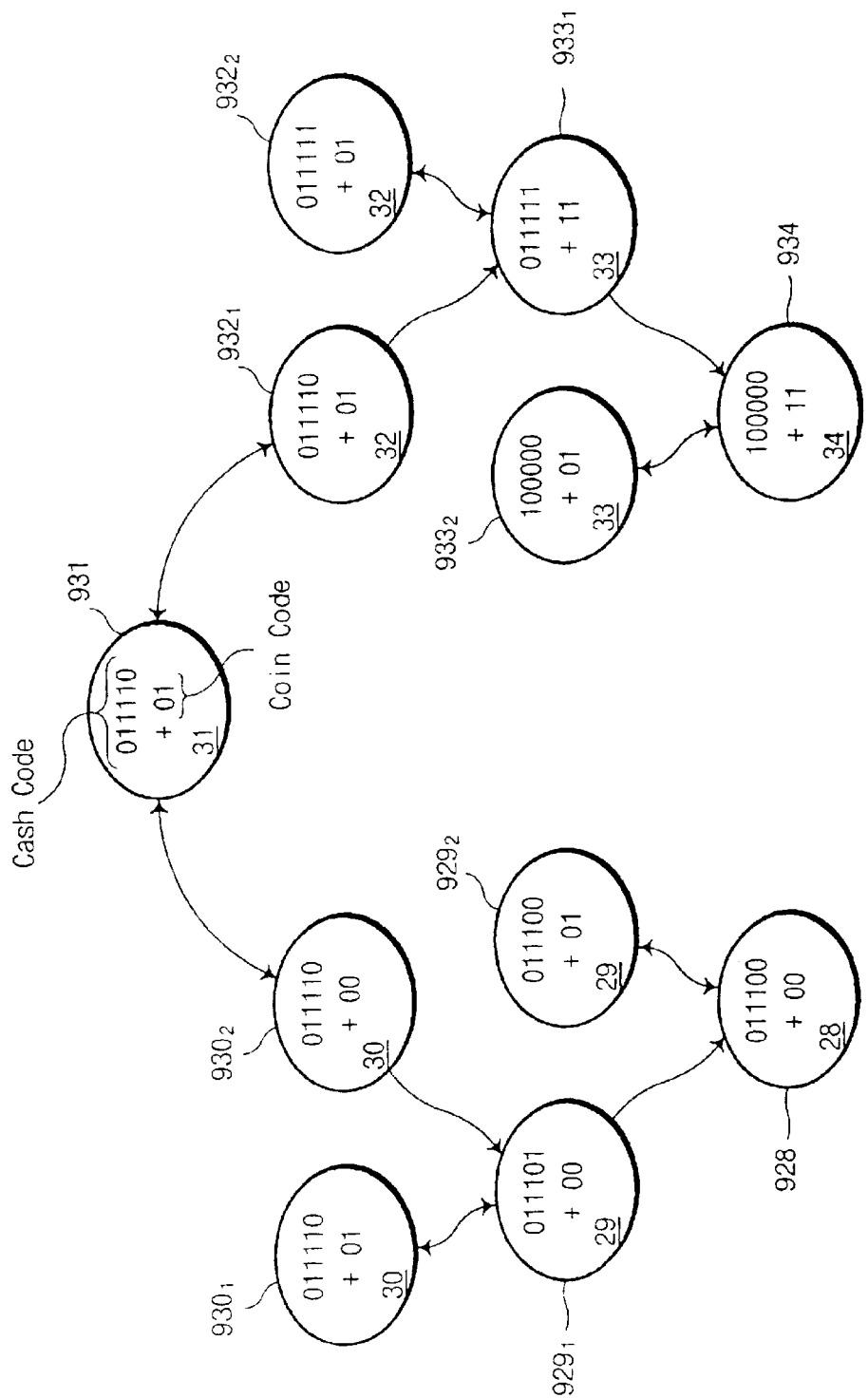
FIG. 9 is a state diagram indicating changes in bit values for an example escalator code according to an embodiment of the invention.

FIG. 9 is a state diagram for the example of an escalator code according to an embodiment of the invention having a 2-bit coin code and a 7 bit cash code. Again, the coin code can be a thermometer code. The upper boundary state of the coin code can be 11 while the lower boundary state can be 00. The cash code can be a binary-weighted code. FIG. 9 illustrates how the coin code portion of the escalator code absorbs changes in counting direction while the cash code portion is unaffected. In addition, FIG. 9 illustrates how different combinations of values taken by the coin code portion and the cash code portion of the escalator code can represent the same numeric values.

In FIG. 9, each oval represents a state of the escalator code. The six bits preceding the "+" correspond to the cash code, while the two bits following the "+" represent the coin code. In addition, the underlined member within the oval represents the decimal equivalent of the escalator code. During typical operation of a delay-locked loop (DLL) according to embodiments of the invention, when the DLL reaches a locked status, the escalator code generator 530 can be set to cycle between two numbers in order to accommodate jitter noise.

First consider the situation in which the locked status and the associated jitter noise are manifested as cycling between the values 29 and 30, as indicated by the oval $929_1$ and $930_1$, respectively. At state $929_1$, the coin code takes the state 00, while the cash code takes the state 011101. If an up-count is received, then the increment can be absorbed by the coin code, as reflected by the state. $930_1$, corresponding to $30_{10}$. If a decrement signal is received while in state $930_1$, the decrement can be absorbed by the coin code thereby returning the escalator code to state $929_1$, corresponding to $29_{10}$. Cycling caused by jitter noise exists between states $929_1$ and $930_1$ without affecting the cash code, i.e., the cash code of each of these states can be the same because the cycling can be absorbed by the coin code.

If a decrement signal is received while the escalator code is at state $929_1$, the decrement can be absorbed by the cash code because the coin code currently is at its lower boundary of 00. Hence, the decrement from state $929_1$ results in the escalator code taking the state 928 in which the coin code is 00 while the cash code is 011100. If an increment signal is then received, the increment can be absorbed by the coin code because it is at the state 00 rather than its upper boundary of 11, hence the escalator code transitions to the state $929_2$, corresponding to $29_{10}$. The cash code in state $929_2$ is the same as in the state 928, but the coin code has changed to 01. If a decrement signal is received while the escalator code is in the state $929_2$, then the decrement can be absorbed by the coin code (01) because it is not at its lower boundary 00. Hence, the escalator code transitions from state $929_2$ back to state 928. It is to be noted that states $929_1$ and $929_2$ both represent $929_{10}$ and yet do so via different combinations of the coin code and the cash code.

Now consider the situation in which the locked status of the DLL and the associated jitter noise are manifested as cycling between 31 and 30, as indicated by the ovals 931 and $930_2$, respectively. In state 931, the coin code is 01 and the cash code is 011110. Receiving a decrement signal while the escalator code is in state 931 results in a transition to the state $930_2$ because the coin code (01) in state 931 is not at the lower boundary (00), i.e., the coin code can absorb the decrement. Inspection of states 931 and $930_2$ reveal that they have the same cash code, but different coin codes. It also reveals that the transition from state 931 to state $930_2$ reflects a transition from $31_{10}$ to $30_{10}$. It is to be noted that states $930_1$ and $930_2$ both represent $30_{10}$ and yet are different combinations of the coin code and the cash code.

Receiving a decrement signal at state $930_2$ transitions the escalator code down to state $929_1$. This transition can be absorbed by the cash code because, in the state $930_2$, the coin code (00) is at its lower boundary. If an increment signal is received while the escalator code is in state $930_2$, the increment can be absorbed by the coin code because, in state $930_2$, the coin code (00) is not at its upper boundary. Hence, an increment at state $930_2$ transitions the escalator code to state 931. Again, cycling between states $930_2$ and 931 can be absorbed by the coin code, not the cash code.

At state 931 corresponding to $31_{10}$, the coin code (01) is not at its upper boundary (11). Receiving an increment signal while in state 931 results in the increment being absorbed by the coin code and the escalator code transitioning to the state $932_1$ (corresponding to $32_{10}$). Inspection of 931 and $932_1$ reveals that their cash codes are the same, but their coin codes are different. In state $932_1$, the coin code (11) is at its upper boundary. If a decrement signal is received in state $932_1$, the decrement can be absorbed by the coin code, hence the escalator code transitions back to state 931.

At state $932_1$, if an increment signal is received, the increment cannot be absorbed by the coin code (11) because it is at its upper boundary. Hence, the increment can be absorbed by the cash code, as reflected by the transition to the state $933_1$. Inspection of states $932_1$ and $933_1$ reveals that their coin codes are the same, but their cash codes are different.

Now consider the situation in which the locked status of the DLL and the associated jitter noise are manifested as cycling between 34 and 33, as indicated by the oval 934 and $933_2$, respectively. If an increment signal is received while the escalator code is in state $933_1$, the escalator code transitions to state 934. In state $933_1$, the coin code (11) is at its upper boundary, so it cannot absorb an increment. Instead, the increment can be absorbed by the cash code. Inspection of states $933_1$ and 934 reveal that their cash codes differ, but their coin codes are the same. Also, the transition from state $933_1$ to state 934 is a multi-bit transition in the cash code.

It is to be observed that states $932_1$ and $932_2$ both represent the value $32_{10}$ albeit using different combinations of the cash code and the coin code. It is also to be observed that cycling back and forth between $33_{10}$ and $32_{10}$ corresponds to cycling between states $933_1$ and $932_2$ wherein the difference can be absorbed by the coin counter. In other words, only the coin counter cycles between states $933_1$ and $932_2$.

If an increment signal is received while the escalator code is in state $933_1$, the escalator code transitions to state 934. In state $933_1$, the coin code (11) is at its upper boundary, so it cannot absorb an increment. Instead, the increment can be absorbed by the cash code. Inspection of states $933_1$ and 934 reveal that their cash codes differ, but their coin codes are the same. Also, the transition from state $933_1$ to state 934 is a multi-bit transition in the cash code.

If a decrement signal is received while in state 934 (again corresponding to $34_{10}$), the decrement can be absorbed by the coin code (11) which is not at its lower boundary (00). Hence, the escalator code responds to a decrement signal by transitioning from state 934 to state $933_2$ (representing $33_{10}$), not state $933_1$. Inspection of states 934 and $933_2$ reveal that they have the same cash code, but different coin codes. If an increment signal is received in state $933_2$, the increment can be absorbed by the coin code (10) because it is not at its upper boundary (11). Hence, an increment received while in state $933_2$ causes the escalator code to transition back to state 934. It is to be observed that cycling between $33_{10}$ and $34_{10}$ involves transitions back and forth between states $933_2$ and 934. For a transition between state $933_2$ and 934, the change can be absorbed by the coin code, not the cash code.

FIG. 9 shows that a multi-bit transition in the cash code can be avoided once cycling begins. Such cycling-induced multi-bit transitions could not be avoided in the DLL arrangements according to the Background Art.

Figure 10:
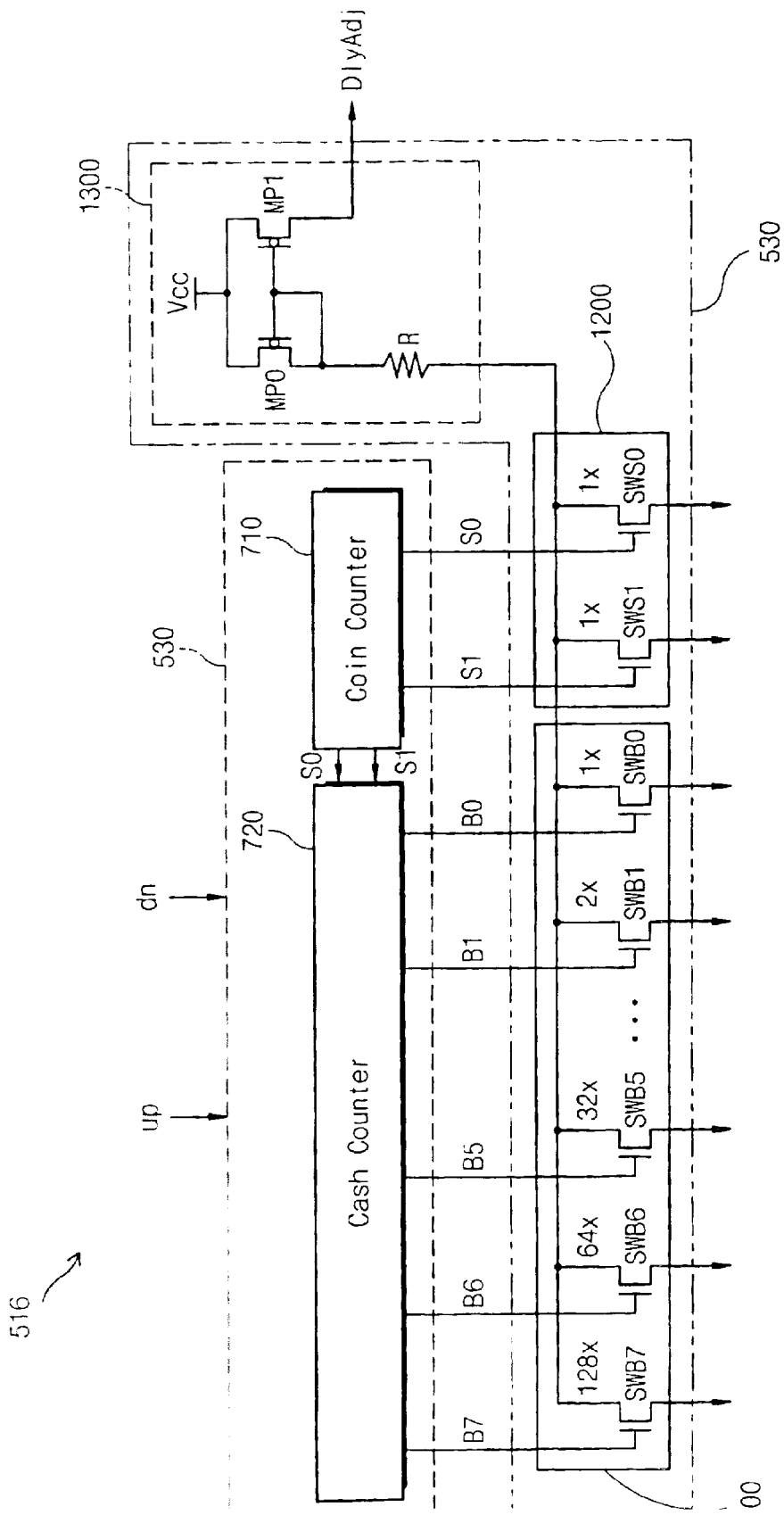
FIG. 10 is a circuit diagram example of a DAC according to an embodiment of the invention.

FIG. 10 is a circuit diagram of an embodiment of the delay control circuit 516 according to an embodiment of the invention. The escalator code generator (EC-GEN) 530 is depicted as including the coin counter 710 in the cash counter 720. The escalator-coded DAC (EC-DAC) 520 is depicted as including two equally-weighted output transistors in a block 1200 corresponding to the coin counter and eight binary-weighted transistors in a converter block 1100 corresponding to the cash counter. The transistors SWS0 and SWS1 correspond to bits as S0 and S1 of the coin code. The transistors SWB0, SWB1 . . . SWB7 correspond to bits B0, B1 . . . B7 of the cash counter. Again, in this example, the cash counter has been limited to 8-bits for simplicity of depiction and explanation. Again, the appropriate number of bits for the cash code, and for the coin code, will depend upon the circumstances to which embodiments of the invention are applied.

As in the Background Art, the weighting of the binary-coded converter 1100 is carried out by varying the widths and lengths of the respective transistors. In the escalator code embodied in the example circuit of FIG. 10, as in the previous examples of the escalator code, bits S0, S1 and B0 all represent the same numeric value, e.g., 1. Accordingly, the width-to-length ratio (W/L) of the transistors SWS0, SWS1 and SWB0 are the same. But the W/L ratios of the transistors SWB1–SWB7 follow the binary weighting. For example, if the W/L ratio of transistor SWB0=W/L, then the corresponding ratio for the transistor SWB1=2 W/L, . . . for transistor SWB5 is 32 W/L, for transistor SWB6 is 64 W/L, etc. The EC-DAC 520 also includes a buffer 1300 of a type similar to the buffer 320 of the Background Art. In operation, the sum of the currents sunk by the respective transistors can be sourced by the buffer 1300 via the resistance R through the transistor MP0. Substantially the same current can be output by the buffer 1300 through the transistor MP1 as the delay adjust signal DLYADJ.

Figure 11A:
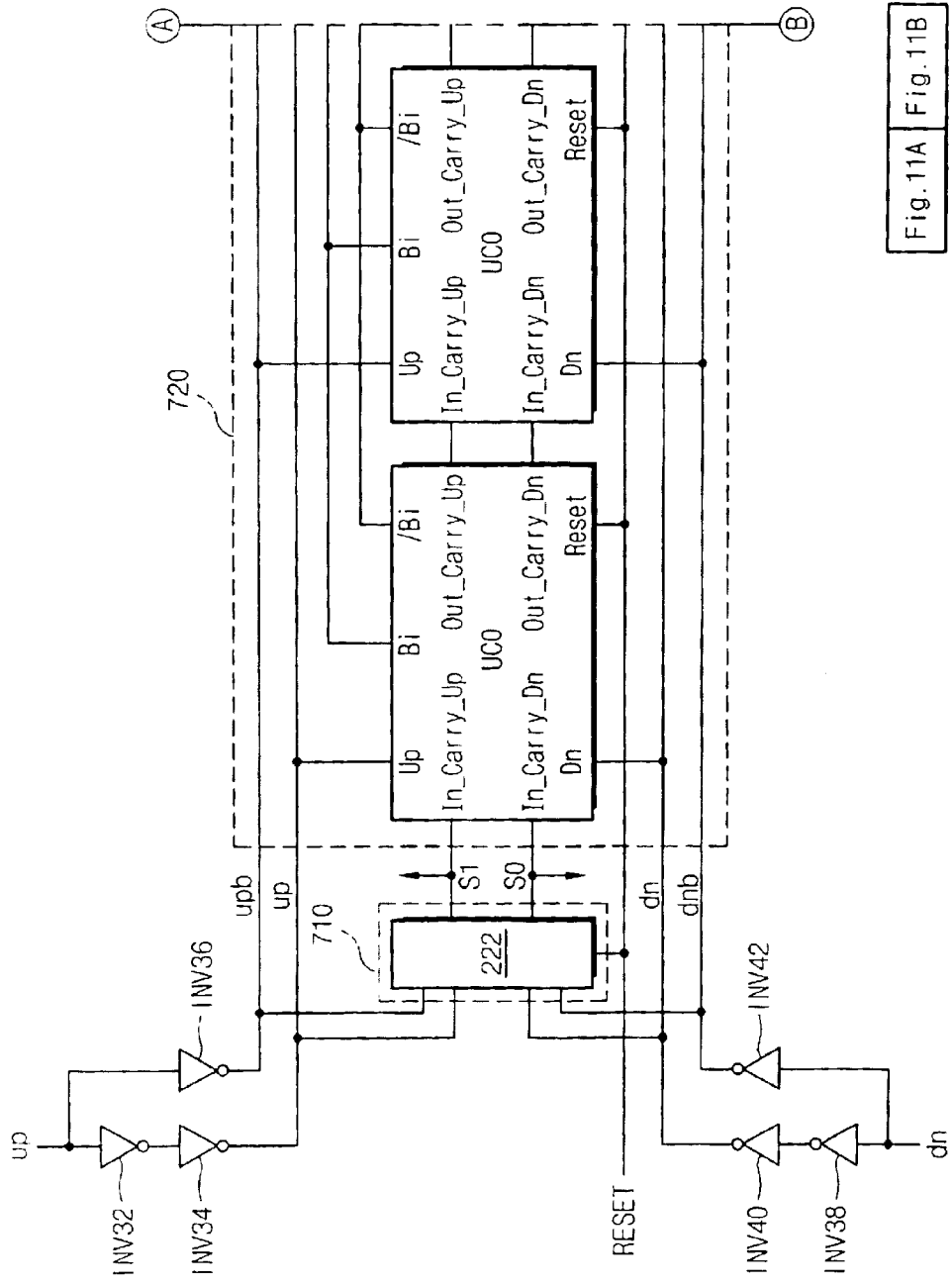
FIGS. 11A–11B are a circuit diagram example of an escalator code generator according to an embodiment of the invention.
Figure 11B:
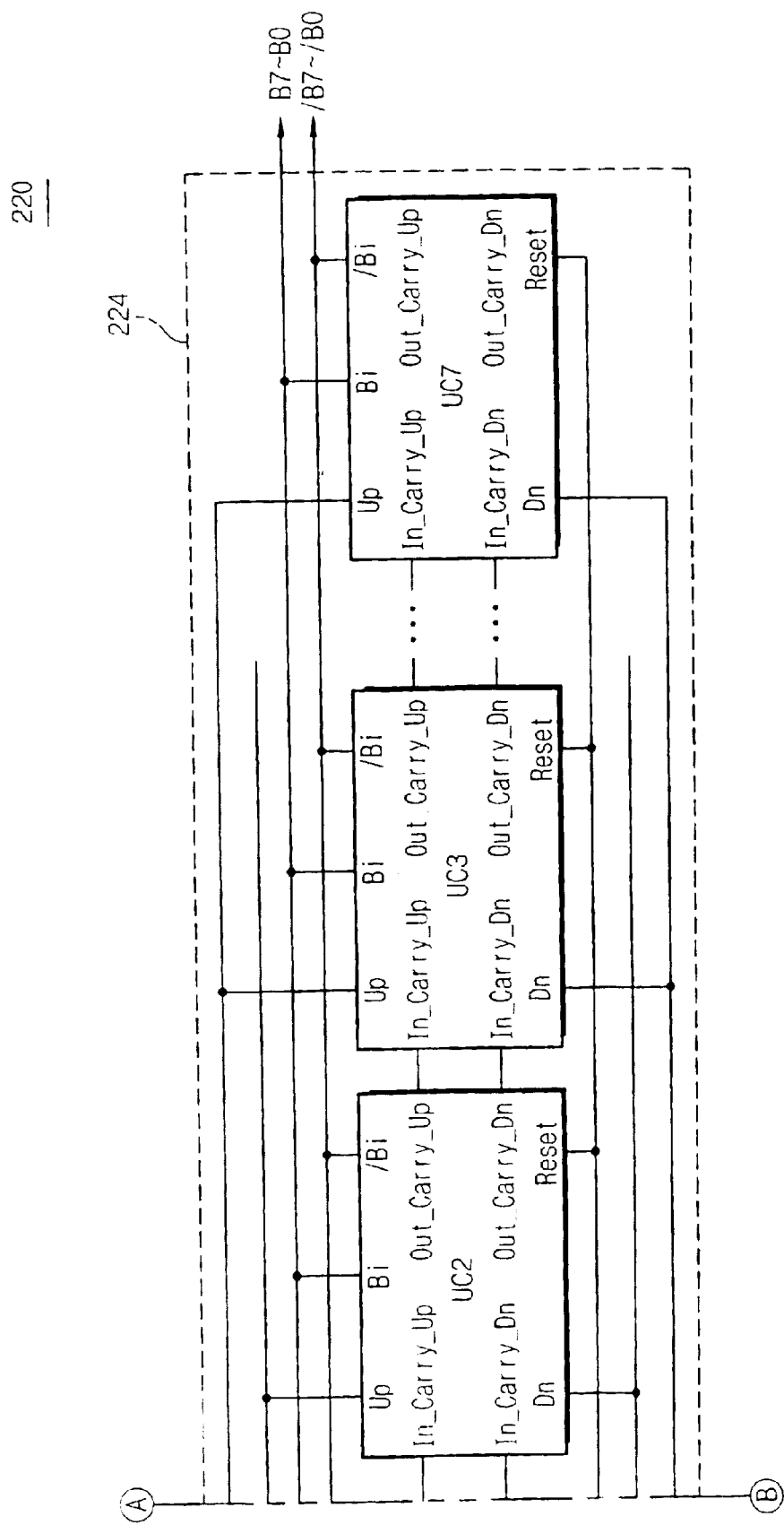

FIGS. 11A–11B are a circuit diagram example of the escalator-code generator (EC-GEN) 530 according to an embodiment of the invention. There, the coin counter 710 is embodied by a logic device 222 while the cash counter 720 can be embodied by a plurality of cascaded logic devices UC0, UC1, UC2, . . . UC7. Again, the embodiment of FIGS. 11A–11B continues the example in which the cash code portion has 8-bits, namely B0–B7, corresponding to logic devices UC0–UC7, respectively.

Figure 12:
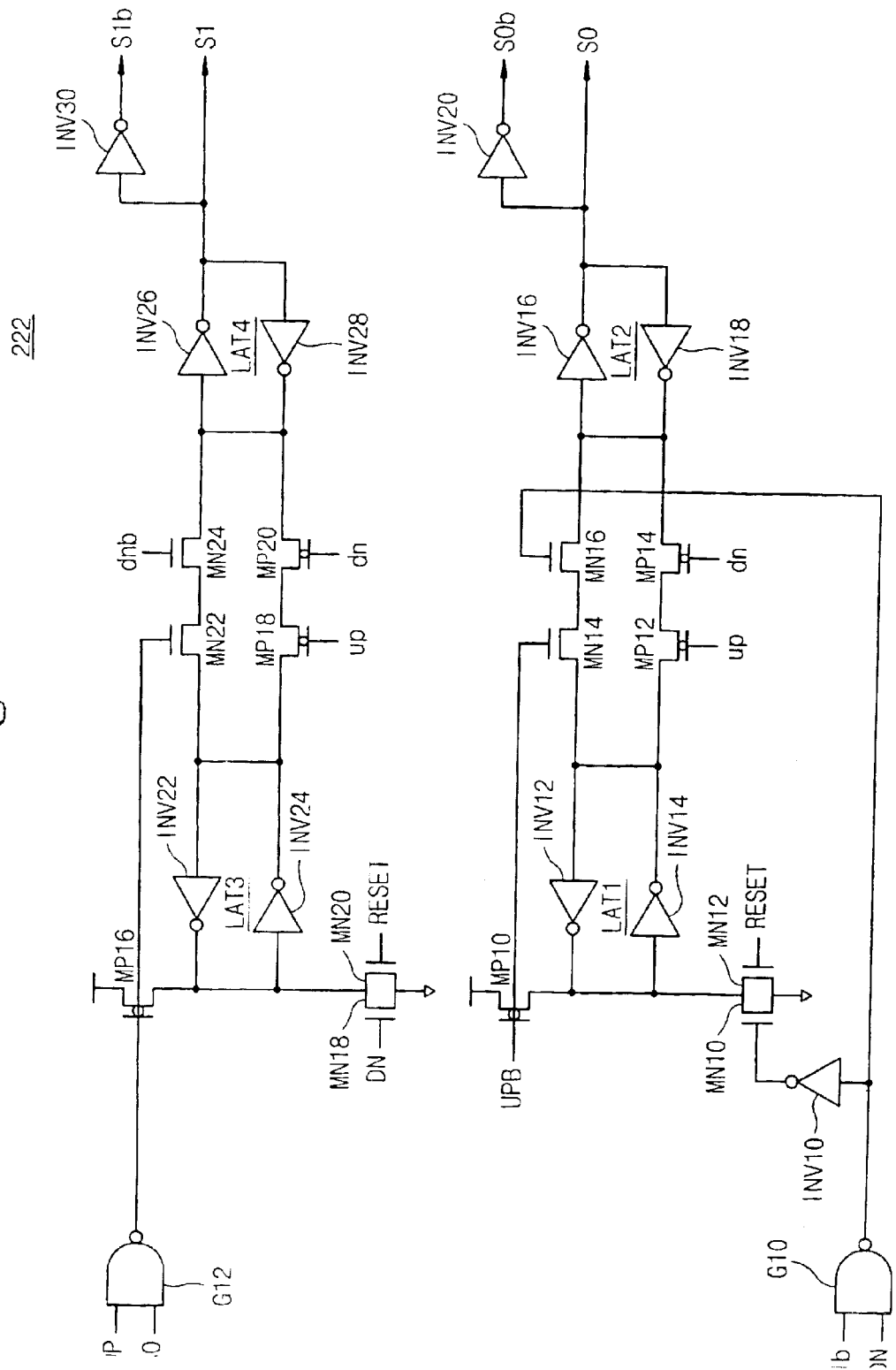
FIG. 12 is a circuit diagram example of a coin counter according to an embodiment of the invention.

Referring to FIG. 12, the coin counter logic device 222 is depicted in more detail. The coin device 222 is initialized by a reset signal RESET and generates a coin code S[i:0] (in this embodiment, i=0, 1) in response to a count-up signal UP and a count-down signal DN. In this embodiment, the coin code is a 2-bit thermometer code expressed as a uniform weight number system. Such a coin code "S1S0" is transmitted to the cash code counter 720 arranged as the next stage. The coin code counter 222 includes NAND gates G10 and G12, PMOS transistors MP10, MP12, MN14, MP16, MP18, and MP20, NMOS transistors MN10, MN12. MN14, MN18, MN20, MN22, and MN24, and inverters INV10, INV12, . . . , and INV30, which are connected as shown in FIG. 12. Pairs of inverters INV12 and INV30, INV16 and INV18, INV22 and INV24, and INV26 and INV28 are each coupled to constitute a latch.

In the above circuit structure, when a coin code signal S0 is "1", the count-up signal UP is transmitted to a coin code signal. S1. When the coin code signal S1 is "1", the count-up signal UP is transmitted to the cash code counter 224. This is explained below in detail.

When the reset signal reset becomes active high, latches LAT1 and LAT3 of the coin code counter 222 are initialized. Afterwards, when the count-up signal UP becomes active, the PMOS transistor MP10 is turned on by an inverted count-up signal UPB. In this case, a value stored in the latch LAT1 is inverted from "0" to "1". Next, when the count-up signal up becomes inactive, the NMOS transistors MN14 and MN16 and the PMOS transistors MP12 and MP14 are turned on. As a result, the value stored in the latch LAT1 is transmitted to the latch LAT2 through the NMOS transistors MN14 and MN16 and the PMOS transistors MP12 and MP14. That is, as the count-up signal up becomes active, the coin code "S1S0" becomes "01".

When the count-up signal up becomes re-active, the output signal UPB of a NAND gate G12 becomes low and a value stored in the latch LAT3 is inverted from "0" to "1". This is because an output signal S0 of the latch LAT2 becomes high. Next, when the count-up signal UP becomes inactive, the NMOS transistors MN22 and MN24 and the PMOS transistors MP18 and MP20 are turned on. As a result, the value stored in the latch LAT3 is transmitted to a latch LAT4 through the NMOS transistors MN22 and MN24 and the PMOS transistors MP18 and MP20. That is, when the count-up signal becomes re-active one more time, the coin code "1 S0" becomes "11".

When the coin code "S1S0" is "11" and the count-up signal becomes re-active, the coin code "S1S0" is maintained, whereas a cash code value is varied. This will be explained in detail later. In conclusion, while a coin code increases in value, a cash code is not affected by the variation of an input binary code.

When a coin code signal S0b is "1", the count-down signal DN is transmitted to the cash code counter 224. When a coin code signal S1b is "1", the count-down signal DN is transmitted to the coin code signal S0. This is now described more fully hereinbelow.

When the coin code "S1S0" is "11" and the count-down signal DN becomes active, the latch LAT3 is initialized through the NMOS transistor MN 18. When the count-down signal DN becomes inactive, a value stored in the latch LAT3 is transmitted to the latch LAT4 through the NMOS transistors MN22 and MN24 and the PMOS transistors MP18 and MP20. As a result, the coin code signal S1 is varied from "1" to "0" and the coin code signal S0 is maintained in a previous value. When the count-down signal DN becomes active once more, the latch LAT1 is initialized through the NMOS transistor MN10. The NMOS transistor MN10 is controlled by an output of the inverter INV10. Because the signal S1b of "1" is transmitted to one input terminal of the NAND gate G10, the NMOS transistor MN10 is turned on when the count-down signal DN becomes active. When the count-down signal DN becomes inactive, the value stored in the latch LAT1 is transmitted to the latch LAT2 through the NMOS transistors MN14 and MN16 and the PMOS transistors MP12 and MP14. As a result, the coin code signal S0 is varied from "1" to "0".

When the coin code "S1S0" is "00" and the count-down signal DN becomes re-active, the coin code "S1S0" is maintained, whereas the cash code value is varied. This will be explained in detail later. In conclusion, while the coin code decreases in value, the cash code is not affected by the variation of the input binary code.

Returning to, FIGS. 11A–11B, the cash code counter 224 operates in response to an output value of the coin code counter 222 and the count-up and count-down signals UP and DN from the phase detector 540. The cash code counter 224 includes eight unit counters UC0–UC7, which are initialized by a reset signal RESET and constitute a 8-bit counter. The even number unit counters UC0, UC2, UC4, and UC6 operate in response to the count-up and count-down signals UP and DN. The odd number unit counters UC1. UC3, UC5, and UC7 operate in response to inverted count-up and count-down signals UPB and DNB. The cash code counter 224 carries out a countup/down operation, which is similar to a binary counter except that the cash code counter 224 is affected by an output of the coin code counter 222.

Figure 13:
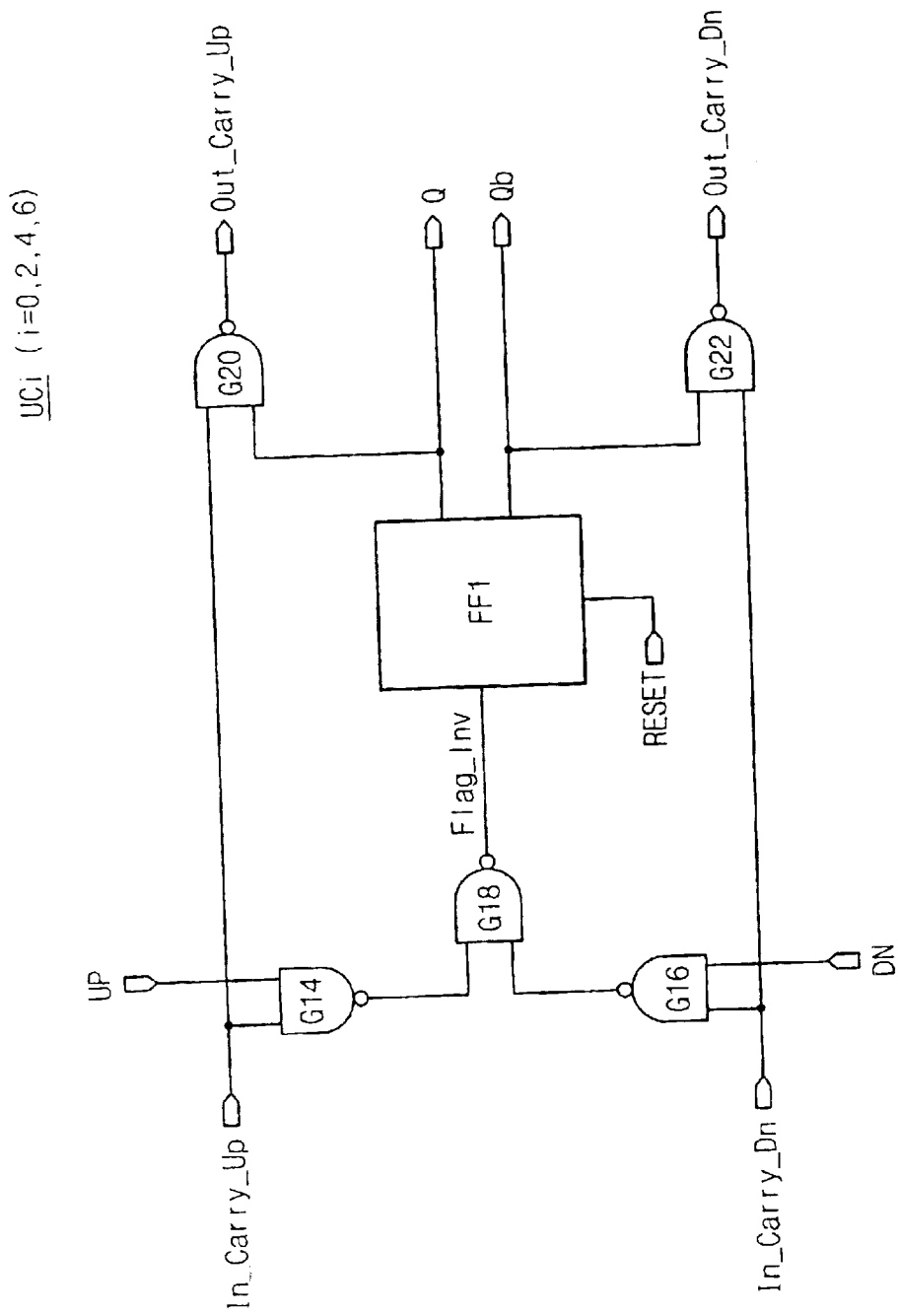
FIG. 13 is a circuit diagram example of even-numbered logic units found in FIGS. 11A–11B.
Figure 14:
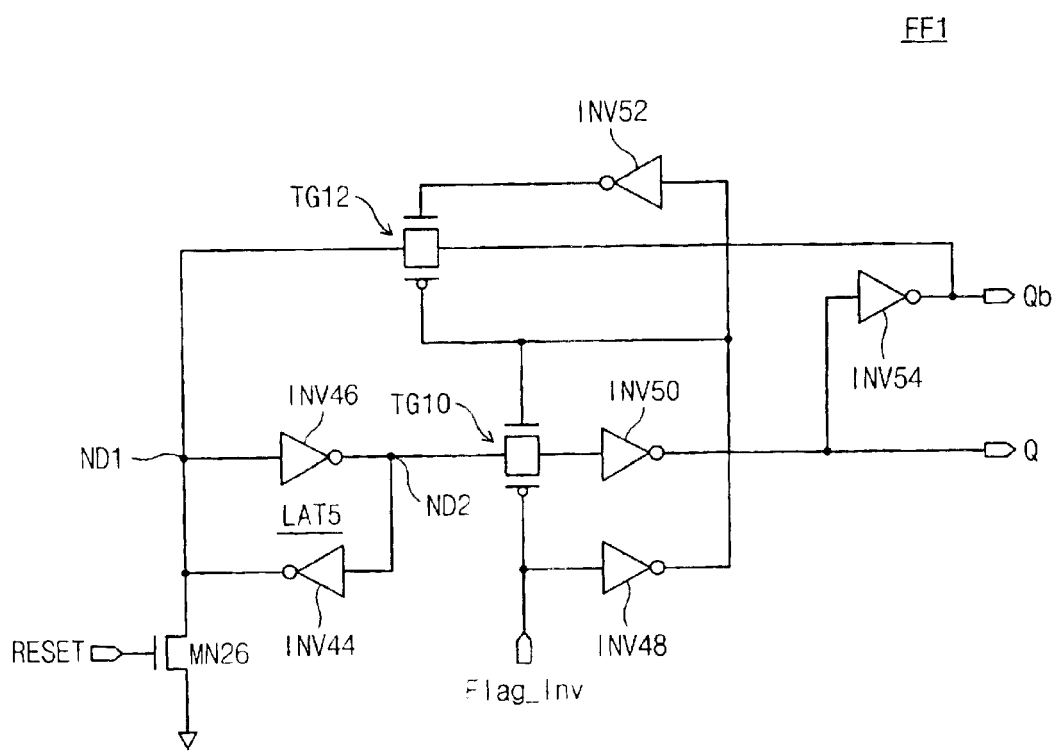
FIG. 14 is a circuit diagram example of a flip-flop unit of FIG. 13.

Any one of the even number counters UC0, UC2, UC6, and UC8 is in more detail via FIG. 13. A unit counter UCi (i=0, 2, 4, and 6) includes five NAND gates G14, G16, G18, G20, and G22 and a flip-flop FF1, which are connected as shown in the figure. The unit counter UCi operates in response to count-up and count-down signals UP and DN and a value stored in a unit counter of a previous stage. The flip-flop FF1 has a latch LAT5 comprised of inverters INV44 and INV46, transmission gates TG10 and TG12, an NMOS transistor MN26, and inverters INV48, INV50, INV52, and INV54, as shown in FIG. 14.

When the reset signal reset becomes active, the latch LAT5 of the flip-flop FF1 is initialized through the NMOS transistor MN26. When an input signal In_Carry_Up is high and the count-up signal UP becomes active, an output signal Flag_Inv of the NAND gate G18 becomes high. When the the input signal In_Carry_Up is high, this indicates that a value stored in a unit counter of a previous stage (or a value of S1 of a coin code counter) is "1". The output signal Flag_Inv of a high level causes the transmission gate TG10 to become inactive, and the transmission gate TG12 to become active. The latch LAT5 is maintained in a previous value or inverted based on an output value Qb. Since the transmission gate TG 10 is in the inactive state, output signals Q and Qb of a flip-flop FF are maintained in previous values. Afterwards, when the count-up signal UP becomes inactive, the output signal Flag_Inv of the NAND gate G18 becomes low. This causes the transmission gate TG10 to become active, and the transmission gate TG12 to become inactive. A value stored in the latch LAT5 is outputted as the output signal Q through the transmission gate TG10. The output signals Q and Qb are transmitted to a unit counter of the next stage through corresponding NAND gates G20 and G22.

For example, when the output signal Q is high, a latch node ND1 of the latch LAT5 of the flip-flop FF1 becomes high and a latch node ND2 becomes low. If signals In_Carry_Up and In_Carry_Dn transmitted from a previous stage are high and low, respectively (all values of unit counters positioned at the previous stage are "1"), the output signal Flag_Inv of the NAND gate G18 becomes high when the count-up signal UP becomes active. This causes the transmission gate TG12 to become active, and the transmission gate TG10 to becomes inactive. The latch node ND1 is coupled to the output signal Qb through the transmission gate TG12. That is, the value stored in the latch LAT5 is inverted from "1" to "0". Afterwards, when the count-up signal UP becomes inactive, the output signal Flag_Inv of the NAND gate G18 becomes low and the value stored in the latch LAT5 is outputted as the output signal g through the transmission gate TG10. The output signal Q and Qb of the unit counter UCi are transmitted to a unit counter of the next stage through corresponding NAND gates G20 and G22.

On the other hand, when the input signal In_Carry_D is high and the count-down signal DN becomes active, the output signal Flag_Inv of the NAND gate G18 becomes high. This causes the transmission gate TG10 to become inactive, and the transmission gate TG 12 to become active. The latch LAT5 is maintained in a previous value or inverted based on the output value Qb. Since the transmission gate TG10 is in the inactive state, the output signal Q and Qb of the flip-flop FF are maintained in previous values. Afterwards, when the count-down signal DN becomes inactive, the output signal Flag_Inv of the NAND gate G18 becomes low. This causes the transmission gate TG10 to become active, and the transmission gate TG12 to become inactive. A value stored in the latch LAT5 is outputted as the output signal Q through the transmission gate TG10. The output signals Q and Qb are transmitted to a unit counter of the next stage through the NAND gates G20 and G22.

For example, when the output signal Q is high, the latch node ND1 of the latch LAT5 of the flip-flop FF1 becomes high and the latch node ND2 becomes low. If the signals In_Carry_Up and In_Carry_Dn transmitted from the previous stage are low and high, respectively (all values stored in unit counters positioned at the previous stage are "0"), the output signal Flag_Inv of the NAND gate G18 becomes high when the count-down signal DN becomes active. This causes the transmission gate TG12 to become active, and the transmission gate TG10 to become inactive. The latch node ND1 is coupled to the output signal Qb through the transmission gate TG12. That is, the value stored in the latch LAT5 is inverted from "1" to "0". Afterwards, when the count-up signal UP becomes inactive, the output signal Flag_Inv of the NAND gate G18 becomes low and the value stored in the latch LAT5 is outputted as the output signal Qb through the transmission gate TG10. The output signals Q and Qb of the unit counter UCi are transmitted to a unit counter of the next stage through corresponding NAND gates G20 and G22.

Figure 15:
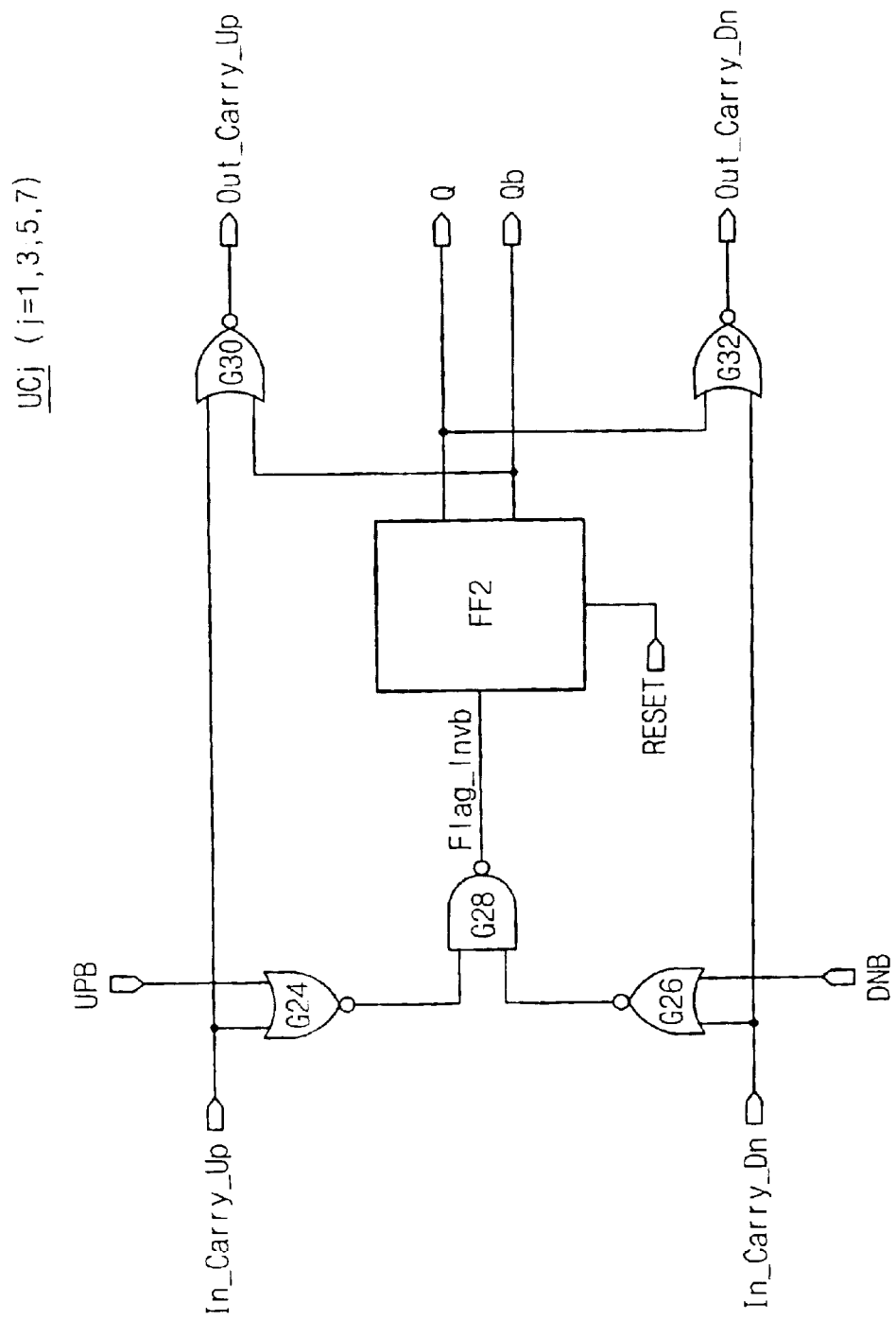
FIG. 15 is a circuit diagram example of odd-numbered logic units of FIGS. 11A–11B.
Figure 16:
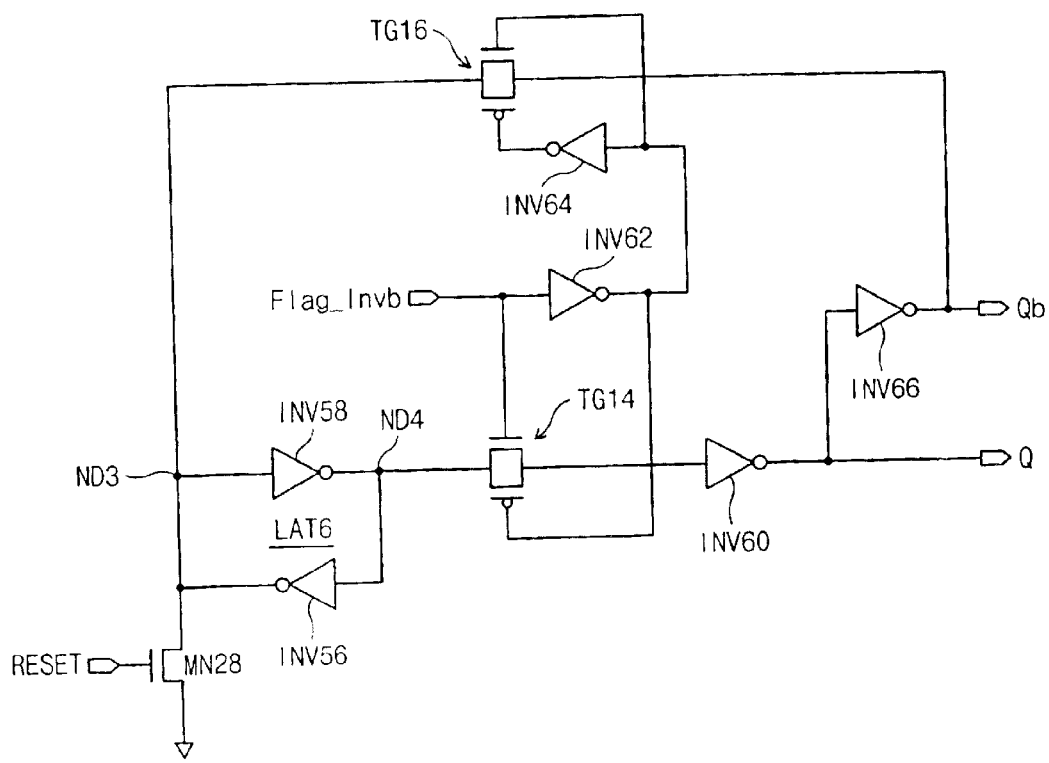
FIG. 16 is a circuit diagram example of a flip-flop unit of FIG. 16.

Any one of the odd number unit counters UC1, UC3, UC5, and UC7 is illustrated in more detail via FIG. 15. A unit counter UCi (i=1, 3, 5, and 7) includes five NOR gates G24. G26, G28, G30, and G32 and a flip-flop FF2, which are connected as shown in the figure. The unit counter UCi operates in response to inverted count-up and count-down signals UPB and DNB and a value stored in a unit counter of a previous stage. The flip-flop FF2 has a latch LAT6 comprised of inverters INV56 and INV58, transmission gates TG14 and TG16, an NMOS transistor MN28, and inverters INV60, INV62, INV64, and INV66, which are connected as shown in FIG. 16.

When the reset signal reset becomes active, a latch LAT6 of the flip-flop FF2 is initialized through the NMOS transistor MN28. When the input signal In_Carry_Up and low and the count-up signal UP becomes active, an output signal Flag_Invb of the NOR gate G28 becomes low. This causes the transmission gate TG14 to become inactive, and the transmission gate TG16 to become active. The latch LAT6 is maintained in a previous value or inverted according to an output signal Qb. Since the transmission gate TG10 is in the inactive state, output signals Q and Qb of a flip-flop FF are maintained in previous values. Afterwards, when the count-up signal up becomes inactive, the output signal Flag_Invb of the NOR gate G28 becomes high. This causes the transmission gate TG14 to become active, and the transmission gate TG16 to become inactive. A value stored in the latch LAT6 is outputted as the output signal Q through the transmission gate TG14. The output signal Q and Qb are transmitted to a unit counter of the next stage through corresponding NOR gates G30 and G32.

For example, when the output signal Q is high, a latch node ND3 of the latch LAT6 of the flip-flop FF2 becomes high and a latch node ND4 thereof becomes low. If signals In_Carry_Up and In_Carry_Dn transmitted from a previous stage are low and high, respectively (all values of unit counters positioned at the previous stage are "11"), the output signal Flag_Inv of the NOR gate G28 becomes low when the count-up signal UP becomes active. This causes the transmission gate TG16 to become active, and the transmission gate TG14 to become inactive. The latch node ND3 is coupled to the output signal Qb through the transmission gate TG16. That is, a value stored in the latch LAT6 is inverted from "1" to "0". Afterwards, when the count-up signal UP becomes inactive, the output signal Flag_Invb of the NOR gate G28 becomes high and the value stored in the latch LAT6 is outputted as the output signal Q through the transmission gate TG14. The output signals Q and Qb of the unit counter UCi are transmitted to a unit counter of the next stage through corresponding NOR gates G30 and G32.

On the other hand, when the input signal In_Carry_Dn is low and the count-down signal DN becomes active, the output signal Flag_Invb of the NOR gate G28 becomes high. This causes the transmission gate TG14 to become inactive, and the transmission gate TG16 to become active. The latch LAT6 is maintained in a previous value or inverted based on the output value Qb. Since the transmission gate TG14 is in the inactive state, the output signals Q and Qb of the flip-flop FF2 are maintained in previous values. Afterwards, when the count-down signal DN becomes inactive, the output signal Flag_Invb of the NOR gate G28 becomes high. This causes the transmission gate TG14 to become active, and the transmission gate TG16 to become inactive. The value stored in the latch LAT6 is outputted as the output signal Q through the transmission gate TG14. The output signal Q and Qb are transmitted to a unit counter of the next stage through corresponding NOR gates G30 and G32.

For example, when the output signal Q is high, a latch node ND3 of the latch LAT6 of the flip-flop FF2 becomes high and a latch node ND4 thereof becomes low. If signals In_Carry_Up and In_Carry_Dn transmitted from a previous stage are high and low, respectively (all values stored in unit counters positioned at the previous stage are "0"), the output signal Flag_Invb of the NOR gate G28 becomes low when the count-down signal DN becomes active. This causes the transmission gate TG16 to become active, and the transmission gate TG14 to become inactive. The latch node ND3 is coupled to the output signal Qb through the transmission gate TG16. That is, the value stored in the latch LAT6 is inverted from "1" to "0". Afterwards, when the count-down signal DN becomes inactive, the output signal Flag_Invb of the NOR gate G28 becomes high and the value stored in the latch LAT6 is outputted as the output signal Q through the transmission gate TG14. The output signals Q and Qb of the counter unit UCi of are transmitted to a unit counter of the next stage through corresponding NOR gate G30 and G32.

Figure 17:
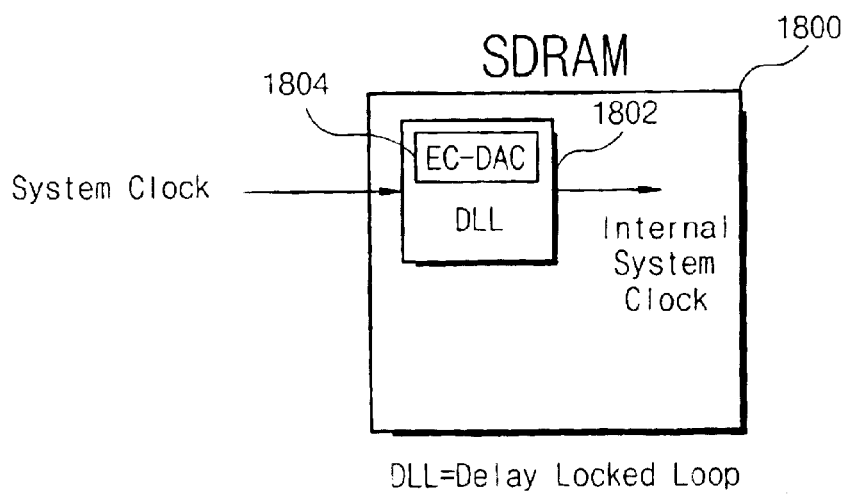
FIG. 17 is a schematic block diagram of a memory device according to an embodiment of the invention.

FIG. 17 is a schematic block diagram of a memory device, e.g., a synchronous DRAM (SDRAM) 1800 according to an embodiment of the invention. The SDRAM 1800 includes a DLL 1802 according to an embodiment of the invention. The DLL 1802 includes an EC-DAC 1804 according to an embodiment of the invention.

Figure 18:
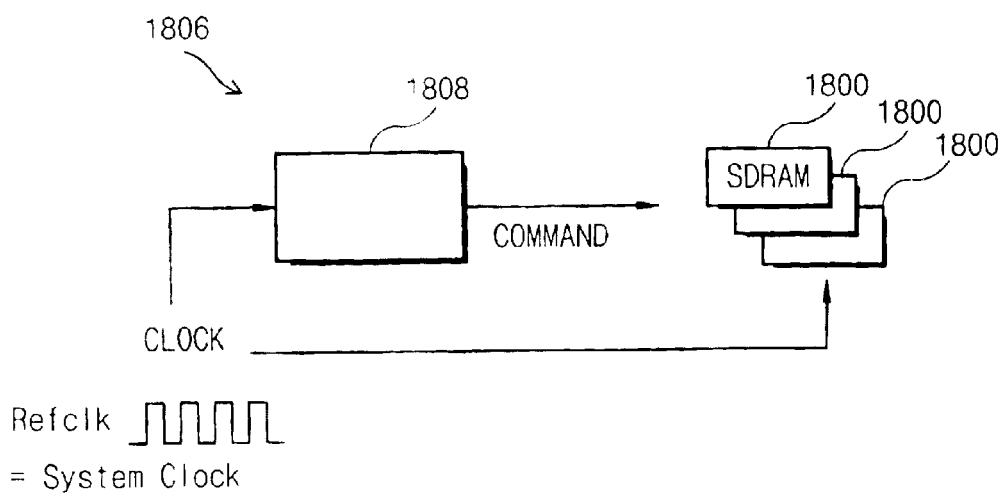
FIG. 18 is a schematic block diagram of a memory system according to an embodiment of the invention.

FIG. 18 is a schematic block diagram of a memory system 1806, according to an embodiment of the invention. The system 1806 includes a well known memory controller 1808 and a plurality of SDRAMs 1800 according to an embodiment of the invention. In FIG. 1806, the memory controller and the plurality of SDRAMs 1,800 each receive a system clock REFCLK. The memory controller 1808 provides memory commands to the plurality of SDRAMs 1800.

An appropriate size of the coin code can be selected by determining the amplitude swing of the jitter that can be expected. Again, this corresponds to the range 220 of Background Art FIG. 2A. The coin code can be selected so as to accommodate the range 220. Doing so will provide a coin code that is large enough to absorb the cycling caused by the jitter 210 without the need to rely upon the cash code to absorb the jitter. In other words, such a design of the cash code eliminates the cycling-induced multi-bit transitions. Again, e.g., as reflected in FIG. 9, cycling that occurs in a locked state of a DLL can be manifested as a transition of 1-bit within the cash code.

The origin of the terms, namely coin code and cash code, lies in the two most common forms of legal tender: coins; and paper money or tender. Though coins are technically considered cash, many people imply only paper money when referring to cash. People typically carry a small amount of money in coins and a much larger amount in cash (paper money). This small versus large dichotomy gives rise to the terms coin code and cash code.

The invention may be embodied in other forms without departing from its spirit and essential characteristics. The described embodiments are to be considered only non-limiting examples of the invention. The scope of the invention is to be measured by the appended claims. All changes which come within the meaning and equivalency of the claims are to be embraced within their scope.

What is claimed:

1. A delay-locked loop (DLL) comprising:
   a variable delay line arrangement operable to receive a reference clock and to output a delayed local clock;
   a phase comparator device operable to compare said reference clock and said local clock and to provide an up/down indication; and a delay control circuit, responsive to said up/down count-indication, to provide a reduced-noise delay control signal to said variable delay line arrangement, said delay control circuit being operable to count said up/down indication using an escalator code arrangement.

2. The DLL of claim 1, wherein said delay control circuit includes:

an escalator code generator, responsive to an externally-provided count trigger signal, to generate an escalator code; and an escalator-code-to-analog converter (ECAC) to convert said escalator code from said generator.

3. The DLL of claim 2, wherein said generator is arranged to represent base 10 numbers with a mixed code having a coin code portion and a cash code portion so as to eliminate multi-bit changes in the cash code portion upon changes in count direction, said coin code corresponding to one or more of the least significant bits of said cash code but fewer than all bits of said cash code; and represent a count in a first direction as a summation of the base 10 number represented by said coin code and the base 10 number represented by said cash code.

4. The DLL of claim 3, wherein said coin code is a thermometer code, and said cash code is a binary-weighted code.

5. The DLL of claim 3, wherein said cash code is one of a binary-weighted code and a thermometer code.

6. A delay-locked loop (DLL) comprising:

variable delay line means for receiving a reference clock and outputting a delayed a local clock;

phase comparator means for comparing said reference clock and said local clock and to provide an up/down indication; and delay control means, responsive to said up/down count-indication, for providing a reduced-noise delay control signal to said variable delay line arrangement, said delay control circuit being operable to count said up/down indication using an escalator code arrangement.

7. A memory device including the DLL of claim 1.

8. The memory device of claim 7, wherein said memory device is a synchronous DRAM.

* * * * *